United States Patent
Shirai et al.

(10) Patent No.: US 6,539,796 B2
(45) Date of Patent: Apr. 1, 2003

(54) LIQUID LEVEL SENSOR, AMPOULE, AND LIQUID AMOUNT DETECTION METHOD

(75) Inventors: Yoshikatsu Shirai, Narita (JP); Yuji Murayama, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/021,262

(22) Filed: Oct. 30, 2001

(65) Prior Publication Data
US 2002/0152809 A1 Oct. 24, 2002

(30) Foreign Application Priority Data

Oct. 30, 2000 (JP) .................................. 2000-331226
Oct. 31, 2000 (JP) .................................. 2000-333667
Oct. 31, 2000 (JP) .................................. 2000-333678

(51) Int. Cl.[7] ........................... G01F 23/00; G01F 23/22
(52) U.S. Cl. ........................................ 73/299; 73/290 R
(58) Field of Search ........................... 73/290 R, 304 R, 73/292, 291, 294, 295, 299

(56) References Cited

U.S. PATENT DOCUMENTS 4,255,961 A * 3/1981 Biltonen et al. ............ 73/15 B
6,067,855 A * 5/2000 Brown et al. ................ 73/308

* cited by examiner

Primary Examiner—Hezron Williams
Assistant Examiner—Rodney Frank
(74) Attorney, Agent, or Firm—Moser, Patterson & Sheridan

(57) ABSTRACT

A liquid level sensor 18 has sensor probes 20a to 21b, and a monitor unit 23. The monitor unit 23 has a probe potential difference detecting section 25 for detecting the output potential difference between sensor probes 20a, 20b, and the output potential difference between sensor probes 21a, 21b; and a liquid level determining section 26 for determining the level of the liquid from the result of detection. The monitor unit 23 has a bubbling detection pulse generator section 28 for detecting an occurrence of bubbling of a bubbling gas from the result of detection by the probe potential difference detecting section 25 and generating a pulse signal, and a pulse counter 29 for counting the number of pulses generated by the bubbling detection pulse generator section 28, thereby making it possible to grasp the number of bubbling periods of the bubbling gas.

38 Claims, 14 Drawing Sheets

LIQUID LEVEL SENSOR, AMPOULE, AND LIQUID AMOUNT DETECTION METHOD

BACKGROUND OF THE INVENTION

1. Field of the Invention

The present invention relates to a liquid level sensor, an ampoule, and a liquid amount detection method which are used in a so-called liquid source bubbling system.

2. Related Background Art

There are cases where liquid level sensors are used in so-called liquid source bubbling systems in which a bubbling gas is introduced into an ampoule so as to generate bubbling in a liquid, thereby producing a desirable process gas. Known as an example of the liquid level sensors is one in which a sensor probe is directly immersed in a liquid contained in an ampoule, so as to detect the level of the liquid.

SUMMARY OF THE INVENTION

However, from the viewpoint of quality control, the above-mentioned liquid source bubbling systems have been desired to monitor not only whether a liquid exists within the ampoule or not, but also whether the liquid decreases in a normal manner nor not, how much the liquid remains within the ampoule, and so forth.

It is an object of the present invention to provide a liquid level sensor, an ampoule, and a liquid amount detection method which can effectively monitor the state of the liquid.

The inventors conducted diligent studies and, as a result, have found that the number of bubbling periods of the bubbling gas and the bubbling time can be grasped in a liquid source bubbling system since the liquid within the ampoule is stirred during the bubbling of the bubbling gas, thus accomplishing the present invention.

Namely, the present invention provides a liquid level sensor for detecting a level of a liquid contained in an ampoule in which a bubbling gas is introduced, the liquid level sensor comprising a self-heating sensor probe and a temperature measuring sensor probe which are disposed within the ampoule; temperature difference detecting means for detecting a temperature difference between the self-heating sensor probe and the temperature measuring sensor probe; and bubbling count means for counting the number of bubbling periods of the bubbling gas according to the temperature difference.

When gas bubbles in an ampoule in which a liquid level sensor having a self-heating sensor probe and a temperature measuring sensor probe is disposed, the liquid within the ampoule is stirred, whereby the temperature difference (output potential difference) between the self-heating sensor probe and the temperature measuring sensor probe approaches zero. Therefore, the number of bubbling periods of the bubbling gas can be counted when the number of actions by which the temperature difference between the two sensor probes approaches zero is counted by the bubbling count means. As a consequence, how the liquid within the ampoule is reduced and the like can be grasped. For example, whether the liquid within the ampoule decreases normally or not can be grasped by seeing how many bubbling periods occur during when the liquid within the ampoule changes from a fulfilled state to an empty state.

Preferably, the liquid level sensor further comprises liquid level determining means for determining a level of the liquid according to the temperature difference. Such a liquid level sensor detects the number of bubbling periods of the bubbling gas together with the level of the liquid within the ampoule, thus being able to monitor the state of the liquid within the ampoule more effectively.

Preferably, the bubbling count means has pulse generating means for generating a pulse signal when the temperature difference decreases by a predetermined amount, and a pulse counter for counting the number of pulses generated by the pulse generating means. This can realize the bubbling count means by a simple configuration, and thus is advantageous in terms of cost.

Preferably, the liquid level sensor further comprises display means for displaying the number of bubbling periods counted by the bubbling count means. As a consequence, the operator can immediately grasp the number of bubbling periods by seeing the display means.

Preferably, a plurality of sensor probe sections each comprising the self-heating sensor probe and the temperature measuring sensor probe are provided, while the sensor probe sections have respective front end positions different from each other. As a consequence, how the liquid decreases within the ampoule can be grasped stepwise.

In another aspect, the present invention provides a liquid level sensor for detecting a level of a liquid contained in an ampoule in which a bubbling gas is introduced, the liquid level sensor comprising a self-heating sensor probe and a temperature measuring sensor probe which are disposed within the ampoule; temperature difference detecting means for detecting a temperature difference between the self-heating sensor probe and the temperature measuring sensor probe; and arithmetic means for determining a bubbling time of the bubbling gas according to the temperature difference and calculating an amount of use of the liquid in the ampoule from the bubbling time.

When gas bubbles in an ampoule in which a liquid level sensor having a self-heating sensor probe and a temperature measuring sensor probe is disposed, the liquid within the ampoule is stirred, whereby the temperature difference (output potential difference) between the self-heating sensor probe and the temperature measuring sensor probe approaches zero. Therefore, by using this characteristic, the arithmetic means calculates the bubbling time of the bubbling gas. Since the amount of use of liquid per unit bubbling time is assumed to be substantially constant, the arithmetic means calculates the amount of use of liquid in the ampoule from the liquid use amount data per unit bubbling time and the bubbling time of the bubbling gas. Since the total amount of liquid within the ampoule in the initial state is determined beforehand, the currently remaining amount of liquid can easily be seen when the amount of use of liquid is known. Since how much the liquid remains within the ampoule can be grasped in an analog fashion as such, it will be sufficient if only one set of self-heating sensor probe and temperature-measuring sensor probe exists, whereby the configuration of the liquid level sensor can be simplified.

Preferably, the liquid level sensor further comprises liquid level determining means for determining a level of the liquid according to the temperature difference. Since such a liquid level sensor detects the amount of the liquid remaining within the ampoule while detecting whether the level of the liquid within the ampoule is higher or lower than a predetermined level, it can monitor the state of the liquid within the ampoule more effectively.

Preferably, the arithmetic means stores liquid use amount data per unit bubbling time beforehand and calculates the amount of use of the liquid in the ampoule from the bubbling time of the bubbling gas and the liquid use amount data per unit bubbling time. In this case, the amount of use of liquid can be obtained without calculating the amount of use of liquid per unit bubbling time in the arithmetic means.

Preferably, the arithmetic means measures an interval from a falling timing period of the temperature difference to a rising timing period of the temperature difference, so as to determine the bubbling time.

Preferably, the liquid level sensor further comprises display means for displaying the amount of use of liquid or remaining amount of liquid in the ampoule calculated by the arithmetic means. As a consequence, the operator can immediately grasp the amount of use or remaining amount of liquid by seeing the display means.

In another aspect, the present invention provides a liquid level sensor for detecting a level of a liquid contained in an ampoule in which a bubbling gas is introduced, the liquid level sensor comprising a self-heating sensor probe and a temperature measuring sensor probe which are disposed within the ampoule; temperature difference detecting means for detecting a temperature difference between the self-heating sensor probe and the temperature measuring sensor probe; and arithmetic means for counting the number of bubbling periods of the bubbling gas according to the temperature difference and calculating an amount of use of the liquid in the ampoule from the number of bubbling periods.

When gas bubbles in an ampoule in which a liquid level sensor having a self-heating sensor probe and a temperature measuring sensor probe is disposed, the liquid within the ampoule is stirred, whereby the temperature difference (output potential difference) between the self-heating sensor probe and the temperature measuring sensor probe approaches zero. When the amount of use of liquid per unit bubbling time is constant in the bubbling of such a bubbling gas, the bubbling time per bubbling period is assumed to be substantially constant. The present invention determines the amount of use of the liquid in the ampoule by using these bubbling characteristics. Namely, the arithmetic means counts the number of bubbling periods of the bubbling gas, and calculates the amount of use of liquid in the ampoule from the number of bubbling periods and the amount of use of liquid per bubbling period. Since the total amount of the liquid within the ampoule in the initial state is determined beforehand, the currently remaining amount of the liquid can easily be seen if the amount of use of the liquid is known. Since how much the liquid remains within the ampoule can be grasped in an analog fashion as such, it will be sufficient if only one set of self-heating sensor probe and temperature-measuring sensor probe exists, whereby the configuration of the liquid level sensor can be simplified.

Preferably, the liquid level sensor further comprises liquid level determining means for determining a level of the liquid according to the temperature difference. Since such a liquid level sensor detects the amount of the liquid remaining within the ampoule while detecting whether the level of the liquid within the ampoule is higher or lower than a predetermined level, it can monitor the state of the liquid within the ampoule more effectively.

Preferably, the arithmetic means stores liquid use amount data per bubbling period beforehand and calculates the amount of use of the liquid in the ampoule from the number of bubbling periods of the bubbling gas and the liquid use amount data per bubbling period. In this case, the amount of use of liquid can be obtained without calculating the amount of use of liquid per bubbling period in the arithmetic means.

Preferably, the arithmetic means detects at least one of a falling timing of the temperature difference and a rising timing of the temperature difference, and counts the number of bubbling periods of the bubbling gas.

Preferably, the liquid level sensor further comprises display means for displaying the amount of use of liquid or remaining amount of liquid in the ampoule calculated by the arithmetic means. As a consequence, the operator can immediately grasp the amount of use or remaining amount of liquid by seeing the display means.

In another aspect, the present invention provides a liquid level sensor for detecting a level of a liquid contained in an ampoule in which a bubbling gas is introduced, the liquid level sensor comprising a first sensor probe section, disposed within the ampoule, comprising a first self-heating sensor probe and a first temperature measuring sensor probe; a second sensor probe section, disposed within the ampoule so as to have a lower end positioned higher than that of the first sensor probe section, comprising a second self-heating sensor probe and a second temperature measuring sensor probe; temperature difference detecting means for detecting a temperature difference between the first self-heating sensor probe and the first temperature measuring sensor probe, and a temperature difference between the second self-heating sensor probe and the second temperature measuring sensor probe; first arithmetic means for calculating an amount of use of liquid per bubbling period of the bubbling gas according to the temperature difference between the second self-heating sensor probe and the second temperature measuring sensor probe; and second arithmetic means for counting the number of bubbling periods of the bubbling gas according to the temperature difference between the first self-heating sensor probe and the first temperature measuring sensor probe, and calculating an amount of use of liquid in the ampoule from the number of bubbling periods and the amount of use of liquid per bubbling period.

When gas bubbles in an ampoule in which a liquid level sensor having a self-heating sensor probe and a temperature measuring sensor probe is disposed, the liquid within the ampoule is stirred, whereby the temperature difference (output potential difference) between the self-heating sensor probe and the temperature measuring sensor probe approaches zero. When the bubbling time per bubbling period is constant in the bubbling of such a bubbling gas, the amount of use of liquid per bubbling period is assumed to be substantially constant. The present invention determines the amount of use of the liquid in the ampoule by using these bubbling characteristics. Namely, the first arithmetic means initially calculates the amount of use of liquid per bubbling period of the bubbling gas according to an output signal of the second sensor probe section. Then, the second arithmetic means counts the number of bubbling periods of the bubbling gas according to an output signal of the first sensor probe section, and calculates the amount of use of liquid from the number of the bubbling periods and the previously determined amount of use of liquid per bubbling period. Here, since the total amount of liquid within the ampoule in the initial state is determined beforehand, the currently remaining amount of liquid can easily be seen when the amount of use of liquid is known. Since how much the liquid remains within the ampoule can be grasped in an analog fashion as such, it will be sufficient if only one set of first sensor probe section exists.

Preferably, the liquid level sensor further comprises liquid level determining means for determining the level of the liquid according to the temperature difference between the first self-heating sensor probe and the first temperature measuring sensor probe. Since such a liquid level sensor detects the amount of the liquid remaining within the ampoule while detecting whether the level of the liquid within the ampoule is higher or lower than a predetermined level, it can monitor the state of the liquid within the ampoule more effectively.

Preferably, the first arithmetic means counts the number of bubbling periods of the bubbling gas until the level of the liquid reaches a height at which the lower end of the second sensor probe section is located according to the temperature differences between the second self-heating sensor probes and the second temperature measuring sensor probes, and calculates the amount of use of liquid per bubbling period. Since the total amount of liquid within the ampoule in the initial state is determined beforehand in this case, for example, the amount of use of liquid per bubbling period can easily be obtained if the amount of liquid is known at the time when the level of the liquid is located as high as the lower end of the second sensor probe section.

Preferably, in this case, the liquid level sensor has a plurality of second sensor probe sections having respective lower end heights different from each other, whereas the first arithmetic means successively counts numbers of bubbling periods of the bubbling gas until the level of the liquid reaches the respective lower end heights of the second sensor probe sections according to the temperature differences between the second self-heating sensor probes and the second temperature measuring sensor probes, and renews the amount of use of liquid per bubbling period. Consequently, as the liquid within the ampoule decreases, more appropriate amount of use of liquid per bubbling period is obtained.

Preferably, the first arithmetic means detects at least one of a falling timing of the temperature difference between the second self-heating sensor probe and the second temperature measuring sensor probe, and a rising timing of the temperature difference, and counts the number of bubbling periods.

Preferably, the second arithmetic means detects at least one of a falling timing of the temperature difference between the first self-heating sensor probe and the first temperature measuring sensor probe, and a rising timing of the temperature difference, and counts the number of bubbling periods.

Preferably, the liquid level sensor further comprises display means for displaying the amount of use of liquid or remaining amount of liquid in the ampoule calculated by the second arithmetic means. As a consequence, the operator can immediately grasp the amount of use or remaining amount of liquid by seeing the display means.

The present invention provides an ampoule comprising a body for accommodating a liquid; a gas inlet section, provided in the body, for introducing a bubbling gas into the body; a gas outlet section, provided in the body, for leading a gas generated by bubbling of the bubbling gas to the outside of the body; a self-heating sensor probe and a temperature measuring sensor probe which are disposed within the body; temperature difference detecting means for detecting a temperature difference between the self-heating sensor probe and the temperature measuring sensor probe; and bubbling count means for counting the number of bubbling periods of the bubbling gas according to the temperature difference.

Since the self-heating sensor probe and temperature measuring sensor probe, the temperature difference detecting means, and the bubbling count means are provided as such, how the liquid within the body decreases and so forth can be grasped as mentioned above.

Preferably, the ampoule further comprises a heater for heating the liquid stored within the body, and a temperature sensor for detecting a temperature of the liquid within the body. As a consequence, a process gas having an appropriate temperature can be generated.

Preferably, the gas outlet section is connected to a film-forming apparatus. In this case, the number of processed substrates can be grasped by counting the number of bubbling periods of the bubbling gas in a film-forming process for the substrates.

In another aspect, the present invention provides an ampoule comprising a body for accommodating a liquid; a gas inlet section, provided in the body, for introducing a bubbling gas into the body; a gas outlet section, provided in the body, for leading a gas generated by bubbling of the bubbling gas to the outside of the body; a self-heating sensor probe and a temperature measuring sensor probe which are disposed within the body; temperature difference detecting means for detecting a temperature difference between the self-heating sensor probe and the temperature measuring sensor probe; and arithmetic means for determining a bubbling time of the bubbling gas according to the temperature difference and calculating an amount of use of liquid from the bubbling time.

Since the self-heating sensor probe and temperature measuring sensor probe, the temperature difference detecting means, and the arithmetic means are provided as such, the amount of liquid remaining within the body can effectively be grasped as mentioned above.

Preferably, the ampoule further comprises a heater for heating the liquid accommodated within the body, and a temperature sensor for detecting a temperature of the liquid within the body. As a consequence, a process gas having an appropriate temperature can be generated.

Preferably, the gas outlet section is connected to a film-forming apparatus. In this case, the number of processed substrates can be grasped by obtaining the total bubbling time of the bubbling gas in a film-forming process for the substrates.

In another aspect, the present invention provides an ampoule comprising a body for accommodating a liquid; a gas inlet section, provided in the body, for introducing a bubbling gas into the body; a gas outlet section, provided in the body, for leading a gas generated by bubbling of the bubbling gas to the outside of the body; a self-heating sensor probe and a temperature measuring sensor probe which are disposed within the body; temperature difference detecting means for detecting a temperature difference between the self-heating sensor probe and the temperature measuring sensor probe; and arithmetic means for counting the number of bubbling periods of the bubbling gas according to the temperature difference and calculating an amount of use of liquid from the number of bubbling periods.

Since the self-heating sensor probe and temperature measuring sensor probe, the temperature difference detecting means, and the arithmetic means are provided as such, the amount of liquid remaining within the body can effectively be grasped as mentioned above.

Preferably, the ampoule further comprises a heater for heating the liquid accommodated within the body, and a temperature sensor for detecting a temperature of the liquid within the body. As a consequence, a process gas having an appropriate temperature can be generated.

Preferably, the gas outlet section is connected to a film-forming apparatus. In this case, the number of processed substrates can be grasped according to the number of bubbling periods of the bubbling gas in a film-forming process for the substrates.

In another aspect, the present invention provides an ampoule comprising a body for accommodating a liquid; a gas inlet section, provided in the body, for introducing a bubbling gas into the body; a gas outlet section, provided in the body, for leading a gas generated by bubbling of the bubbling gas to the outside of the body; a first sensor probe section, disposed within the body, comprising a first self-heating sensor probe and a first temperature measuring sensor probe; a second sensor probe section, disposed within the body so as to have a lower end positioned higher than that of the first sensor probe section, comprising a second self-heating sensor probe and a second temperature measuring sensor probe; temperature detecting means for detecting a temperature difference between the first self-heating sensor probe and the first temperature measuring sensor probe, and a temperature difference between the second self-heating sensor probe and the second temperature measuring sensor probe; first arithmetic means for calculating an amount of use of liquid per bubbling period of the bubbling gas according to the temperature difference between the second self-heating sensor probe and the second temperature measuring sensor probe; and second arithmetic means for counting the number of bubbling periods of the bubbling gas according to the temperature difference between the first self-heating sensor probe and the first temperature measuring sensor probe and calculating an amount of use of the liquid from the number of bubbling periods and the amount of use of liquid per bubbling period.

Since the first sensor probe section, the second sensor probe section, the temperature difference detecting means, the first arithmetic means, and the second arithmetic means are provided as such, the amount of use and remaining amount of liquid within the body can effectively be grasped as mentioned above. Also, even when the amount of use of liquid per bubbling period fluctuates due to individual differences among apparatus connected to the gas outlet section of the ampoule, appropriate amount of use of liquid and remaining amount of liquid can always be obtained since the first arithmetic means calculates the current amount of use of liquid per bubbling period.

Preferably, the ampoule further comprises a heater for heating the liquid accommodated within the body, and a temperature sensor for detecting a temperature of the liquid within the body. As a consequence, a process gas having an appropriate temperature can be generated.

Preferably, the gas outlet section is connected to a film-forming apparatus. In this case, the number of processed substrates can be grasped according to the number of bubbling periods of the bubbling gas in a film-forming process for the substrates.

The present invention provides a liquid amount detection method comprising the steps of arranging a self-heating sensor probe and a temperature measuring sensor probe within an ampoule into which a bubbling gas is introduced; detecting a temperature difference between the self-heating sensor probe and the temperature measuring sensor probe; and counting the number of bubbling periods of the bubbling gas according to the temperature difference. As a consequence, how the liquid decreases within the ampoule and the like can be grasped as mentioned above.

In another aspect, the present invention provides a liquid amount detection method comprising the steps of arranging a self-heating sensor probe and a temperature measuring sensor probe within an ampoule into which a bubbling gas is introduced; detecting a temperature difference between the self-heating sensor probe and the temperature measuring sensor probe; determining a bubbling time of the bubbling gas according to the temperature difference; and calculating an amount of use of a liquid accommodated within the ampoule from the bubbling time. As a consequence, the amount of liquid remaining within the ampoule can effectively be grasped as mentioned above.

In another aspect, the present invention provides a liquid amount detection method comprising the steps of arranging a self-heating sensor probe and a temperature measuring sensor probe within an ampoule into which a bubbling gas is introduced; detecting a temperature difference between the self-heating sensor probe and the temperature measuring sensor probe; counting the number of bubbling periods of the bubbling gas according to the temperature difference; and calculating an amount of use of a liquid accommodated within the ampoule according to the number of bubbling periods. As a consequence, the amount of liquid remaining within the ampoule can effectively be grasped as mentioned above.

In another aspect, the present invention provides a liquid amount detection method comprising the steps of using a liquid level sensor constituted by a first sensor probe section, disposed within an ampoule into which a bubbling gas is introduced, comprising a first self-heating sensor probe and a first temperature measuring sensor probe, and a second sensor probe section, disposed within the ampoule so as to have a lower end positioned higher than that of the first sensor probe section, comprising a second self-heating sensor probe and a second temperature measuring sensor probe; detecting a temperature difference between the second self-heating sensor probe and the second temperature measuring sensor probe; calculating an amount of use of liquid per bubbling period of the bubbling gas according to the temperature difference; detecting a temperature difference between the first self-heating sensor probe and the first temperature measuring sensor probe thereafter; counting the number of bubbling periods of the bubbling gas according to the temperature difference; and calculating an amount of use of a liquid accommodated within the ampoule according to the number of bubbling periods and the amount of use of liquid per bubbling period. As a consequence, the amount of liquid remaining within the ampoule can effectively be grasped as mentioned above.

DESCRIPTION OF THE PREFERRED EMBODIMENTS

In the following, preferred embodiments of the liquid level sensor, ampoule, and liquid amount detection method in accordance with the present invention will be explained with reference to the drawings.

Figure 1:
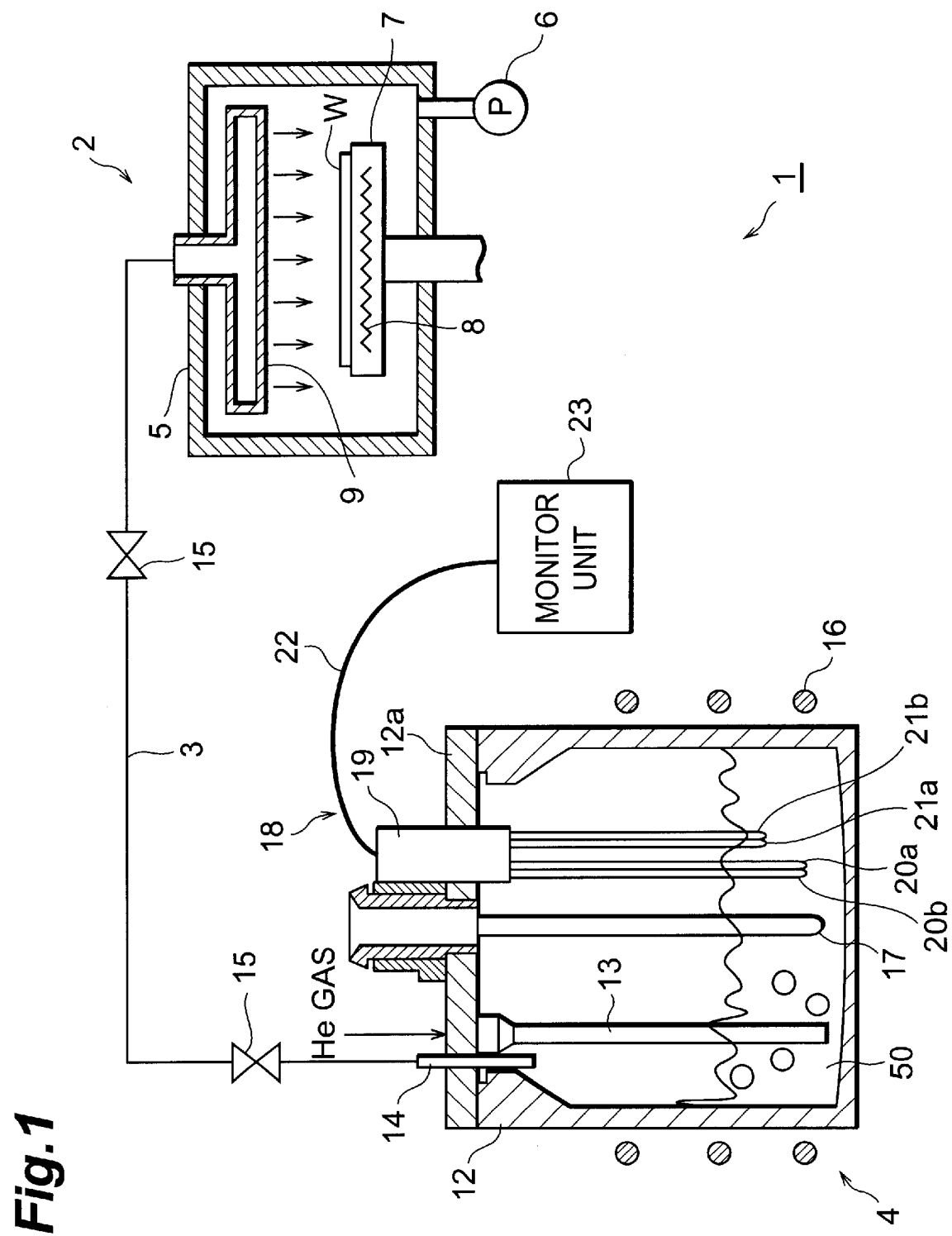
FIG. 1 is a diagram showing an outline of a film-forming system including a first embodiment of the ampoule in accordance with the present invention.

To begin with, a first embodiment of the present invention will be explained with reference to FIGS. 1 to 4. FIG. 1 is a diagram showing an outline of a film-forming system including the first embodiment of the ampoule in accordance with the present invention. In this drawing, the film-forming system 1 is used for forming a titanium nitride (TiN) film on a surface of a semiconductor wafer W. The film-forming system 1 has a CVD apparatus 2 and an ampoule 4 connected to the CVD apparatus 2 by way of a gas pipe 3.

The CVD apparatus 2 has a process chamber 5. The pressure within the process chamber 5 is reduced by a vacuum pump 6. Disposed within the processing chamber 5 is a pedestal 7 for supporting the wafer W. The pedestal 7 is provided with a heater 8 for heating the wafer W. Disposed above the pedestal 7 is a gas distributing plate 9. The gas distributing plate 9 is connected to the gas pipe 3, whereby a tetradimethylamino titanium (TDMAT) gas, which is a film-forming gas (process gas), fed from the liquid storage ampoule 4 is uniformly blown toward the wafer W. Then, TDMAT having reached the heated wafer W is thermally decomposed, whereby a film-forming process is carried out.

The ampoule 4 connected to such a CVD apparatus 2 has a cylindrical body 12 for storing a tetradimethylamino titanium liquid (TDMAT liquid) 50. The body 12 is preferably constituted by a material such as stainless steel or the like having a high strength and a corrosion resistance with respect to the TDMAT liquid 50.

The body 12 has a lid portion 12a provided with a gas inlet pipe (gas inlet section) 13 for introducing a helium (He) gas into the body 12. The gas inlet pipe 13 extends to the vicinity of the bottom face of the body 12, so that the He gas bubbles within the TDMAT liquid 50. The bubbling of the He gas vaporizes the TDMAT liquid 50, thereby generating the TDMAT gas, which is a film-forming gas. The lid portion 12a of the body 12 is also provided with a gas outlet pipe (gas outlet section) 14 for letting out the TDMAT gas, whereas the gas pipe 3 is connected to the gas outlet pipe 14. The gas pipe 3 is provided with a plurality of opening/closing valves 15.

Disposed outside the body 12 is a heater 16 for heating the TDMAT liquid 50 within the body 12. Disposed within the body 12 is a temperature sensor 17 for detecting the temperature of the TDMAT liquid 50. While the temperature sensor 17 monitors the temperature of the TDMAT liquid 50, the heater 16 heats the TDMAT liquid 50. Here, the TDMAT liquid 50 is set to a temperature (e.g., 50° C.) at which the film-forming process by the CVD apparatus 2 becomes stable.

Such an ampoule 4 is provided with a thermosensitive liquid level sensor 18 for detecting the liquid level of the TDMAT liquid 50. The liquid level sensor 18 has a base portion 19 detachably attached to the lid portion 12a of the body 12. Attached to the lower face of the base portion 19 are two sets of sensor probe sections constituted by sensor probes 20a, 20b for detecting an empty level and sensor probes 21a, 21b for detecting an alarm level.

Figure 2:
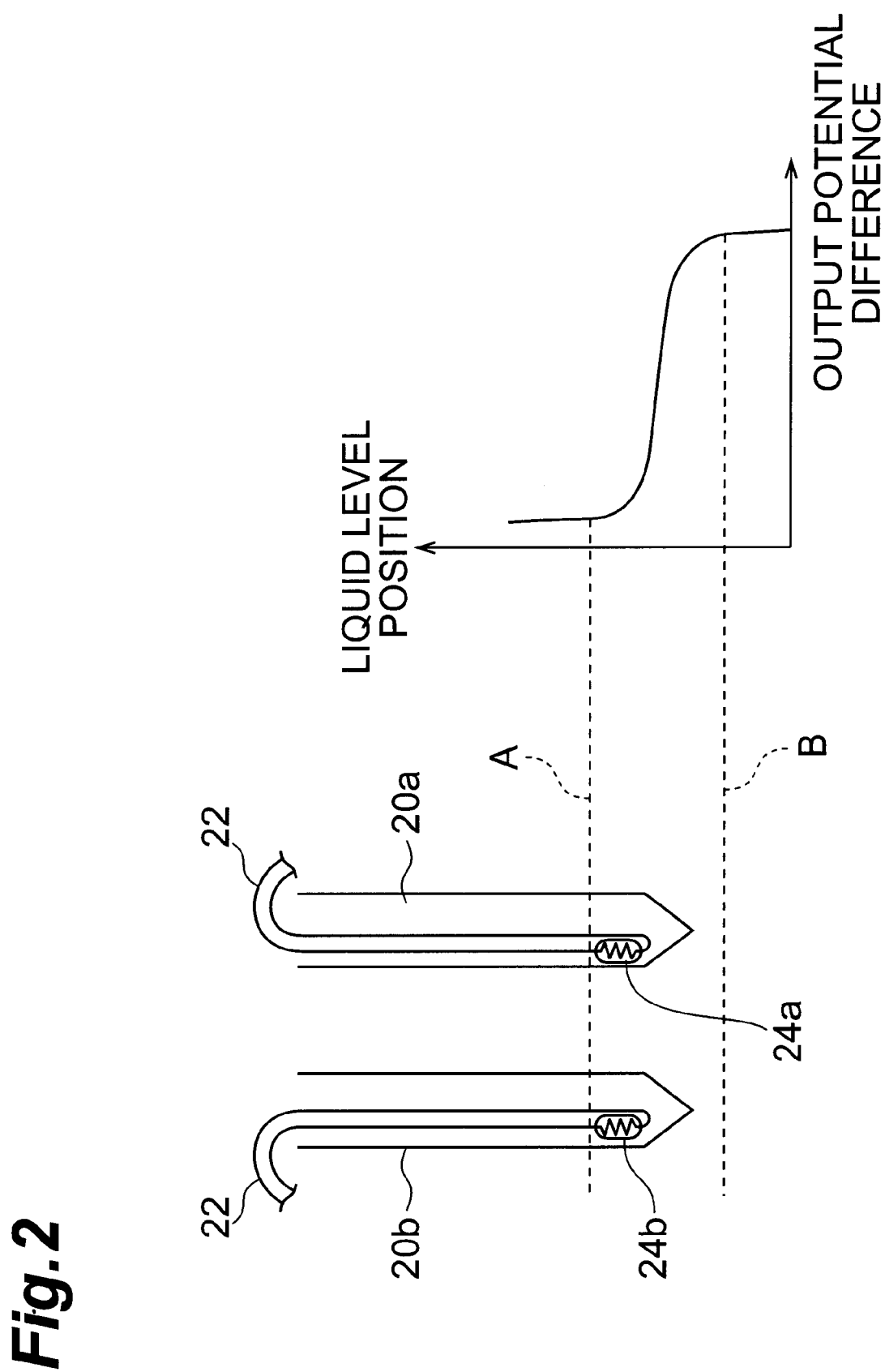
FIG. 2 is a view showing a principle for detecting the level of a liquid by using a liquid level sensor shown in FIG. 1.

The sensor probes 20a to 21b are arranged such that their front end sides extend downward within the body 12 so as to be immersed in the TDMAT liquid 50. Here, the front ends of the sensor probes 21a, 21b for detecting the alarm level are positioned higher than those of the sensor probes 20a, 20b for detecting the empty level. Also, the sensor probes 20a to 21b are connected to a monitor unit 23 by way of leads 22. FIG. 2 shows a principle of liquid level detection carried out by such sensor probes 20a to 21b.

In FIG. 2, the sensor probes 20a, 20b have respective sheaths made of stainless steel (not depicted), whereas platinum temperature-measuring resistors 24a, 24b having stable temperature characteristics are attached to the inside of sheaths in the front end part of the sensor probes 20a, 20b. The platinum temperature-measuring resistors 24a, 24b are connected to the leads 22. The sensor probe 20a is a self-heating high-temperature sensor probe, whereas the sensor probe 20b is a temperature measuring low-temperature sensor probe. The liquid level of the TDMAT liquid is detected by utilizing the temperature difference occurring between the sensor probes 20a, 20b.

Specifically, when the front end parts of the sensor probes 20a, 20b (platinum temperature-measuring resistors 24a, 24b) are located in the TDMAT liquid (see the liquid level A in FIG. 2), the heat generated by the self-heating sensor probe 20a escapes into the TDMAT liquid, thereby diffusing the heat. As a consequence, the temperature difference between the sensor probes 20a, 20b decreases, thereby reducing the difference in resistance value between the platinum temperature-measuring resistors 24a, 24b. In actual measurement, the difference in resistance value between the platinum temperature-measuring resistors 24a, 24b is outputted as a potential difference applied to the platinum temperature-measuring resistors 24a, 24b (potential difference between the sensor probes 20a, 20b) When the front end parts of the sensor probes 20a, 20b (platinum temperature-measuring resistors 24a, 24b) are not located in the TDMAT liquid but in the TDMAT gas (see the liquid level B in FIG. 2), by contrast, the part of heat escaping into the TDMAT gas in the heat generated in the self-heating sensor probe 20a is very small. As a consequence, the temperature difference between the sensor probes 20a, 20b becomes greater, thereby increasing the difference in resistance value between the platinum temperature-measuring resistors 24a, 24b (output potential difference between the sensor probes 20a, 20b) . Thus, whether the front end parts of the sensor probes 20a, 20b are located in the TDMAT liquid or the TDMAT gas can be seen according to the output potential difference between the sensor probes 20a, 20b.

In the sensor probes 21a, 21b for detecting the alarm level, the sensor probe 21a is a self-heating high-temperature sensor probe, whereas the sensor probe 21b is a temperature measuring low-temperature sensor probe. The sensor probes 21a, 21b are configured as with the sensor probes 20a, 20b. When two sets of sensor probes 20a, 20b and sensor probes 21a, 21b are provided as such, how the TDMAT liquid decreases within the body 12 can be grasped stepwise.

Namely, when the front end parts of the sensor probes 21a, 21b are located within the TDMAT liquid, a sufficient amount of the TDMAT liquid remains within the body 12, whereby the liquid level becomes a remaining level. When the front end parts of the sensor probes 21a, 21b are located within the TDMAT gas while the front end parts of the sensor probes 20a, 20b are within the TDMAT liquid, the amount of TDMAT liquid remaining in the body 12 is so small that the liquid level becomes the alarm level. When the front end parts of the sensor probes 20a, 20b are located within the TDMAT gas, the TDMAT liquid hardly remains within the body 12, whereby the liquid level becomes the empty level.

Figure 3:
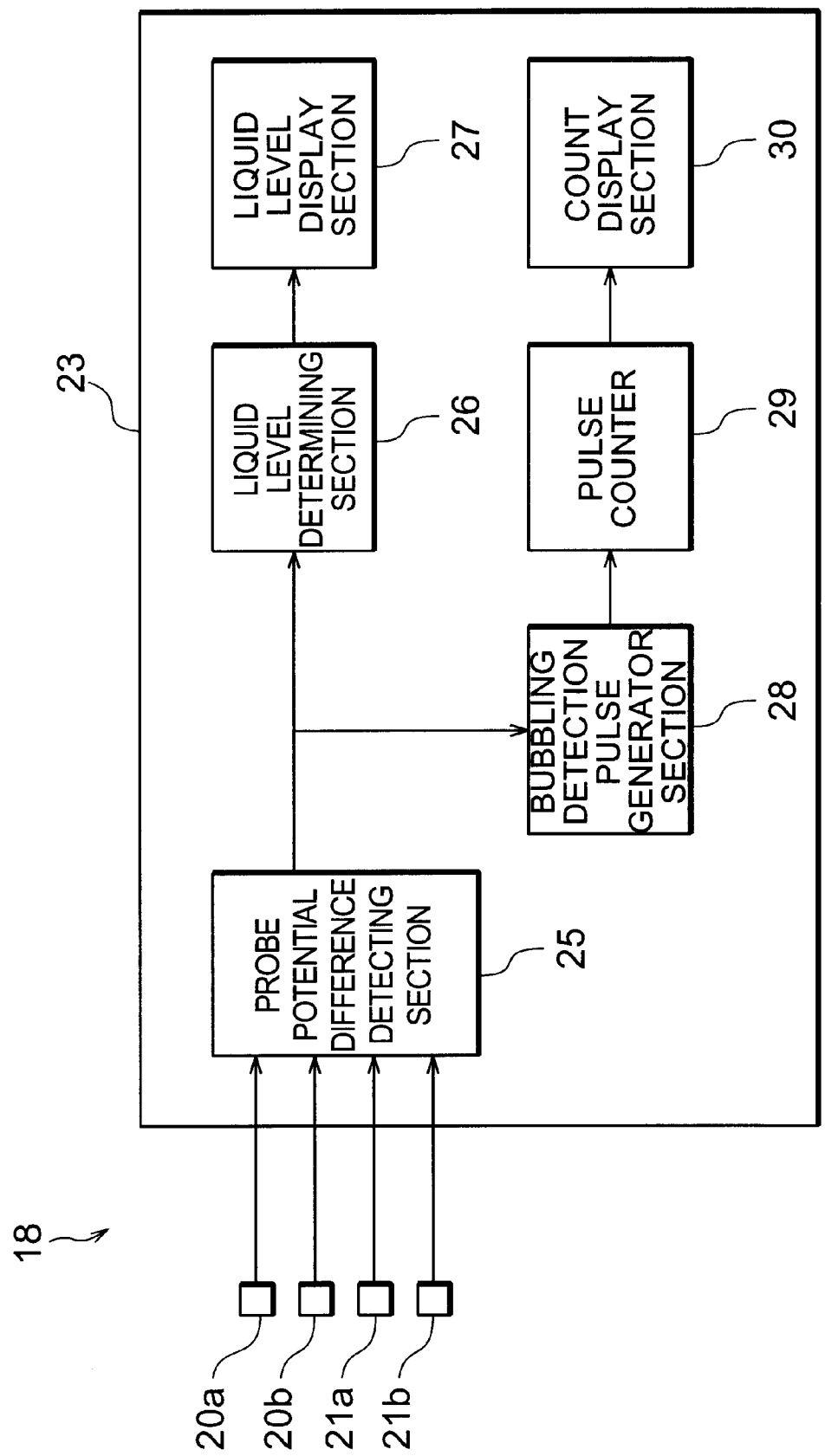
FIG. 3 is a view showing the configuration of the monitor unit shown in FIG. 1.

Such determination of the liquid level of TDMAT liquid is carried out by the monitor unit 23. As shown in FIG. 3, the monitor unit 23 has a probe potential difference detecting section (temperature difference detecting means) 25, a liquid level determining section (liquid level determining means) 26, and a liquid level display section 27.

The probe potential difference detecting section 25 detects the respective output potential differences (temperature differences) between the above-mentioned sensor probes 20a, 20b for detecting the empty level and between the above-mentioned sensor probes 21a, 21b for detecting the alarm level. The liquid level determining section 26 determines whether the liquid level of the TDMAT liquid is located at the above-mentioned remaining level, alarm level, or empty level according to the output potential difference between the sensor probes 20a, 20b and the output potential difference between the sensor probes 21a, 21b. Each of the probe potential difference detecting section 25 and the liquid level determining section 26 is constituted by an operational amplifier, for example. The liquid level display section 27 displays the liquid level of the TDMAT liquid (whether it is the above-mentioned remaining level, alarm level, or empty level) by means of LED or the like.

Also, the monitor unit 23 has a bubbling detection pulse generator section (pulse generating means) 28, a pulse counter 29, and a count display section 30 in order to exhibit a function of detecting the number of bubbling periods of the He gas in addition to the above-mentioned function of detecting the liquid level of the TDMAT liquid.

Figure 4:
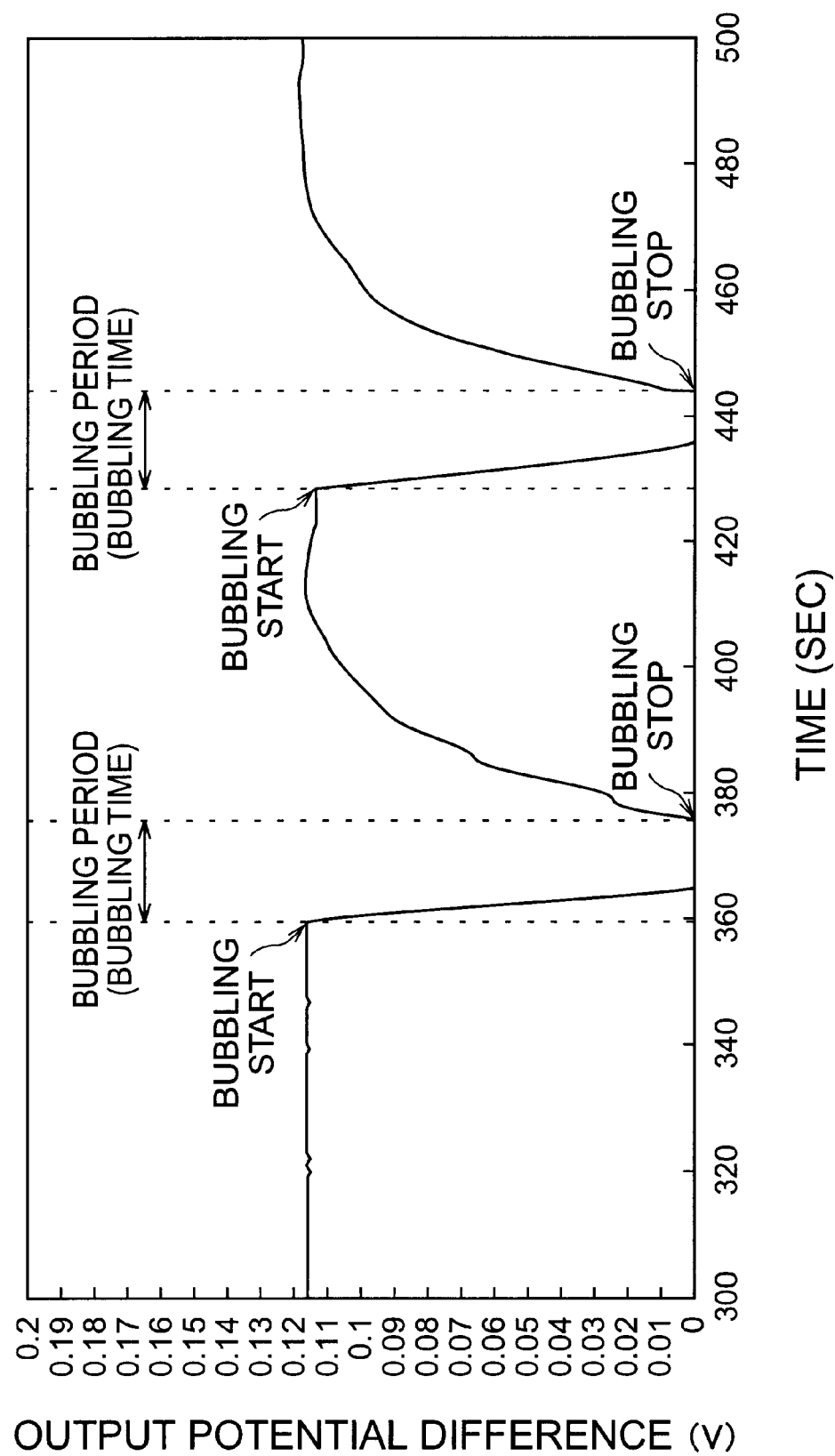
FIG. 4 is a chart showing the fluctuation in output potential difference between a self-heating sensor probe and a temperature measuring sensor probe occurring when a bubbling gas bubbles in an ampoule.

Here, when the He gas bubbles in the state where the TDMAT liquid is contained within the body 12, the TDMAT liquid within the body 12 vibrates vigorously, so that the TDMAT liquid is stirred, whereby the output potential difference (temperature difference) between the self-heating sensor probe and the temperature measuring sensor probe approaches zero. FIG. 4 shows an example thereof.

When the front end parts of both the self-heating sensor probe and the temperature measuring sensor probe are located within the TDMAT liquid, the output potential difference between the two sensor probes is at a standard in-liquid level (about 0.12 V in the graph) in the state where no bubbling of the He gas occurs in FIG. 4. When the He gas bubbles in this state, the output potential difference between the sensor probes drastically decreases, so as to become 0 V in about 5 seconds. When the He gas stops bubbling, the output potential difference rises from 0 V, and returns to the above-mentioned standard in-liquid level in a few seconds.

The monitor unit 23 detects the number of bubbling periods of the He gas by utilizing such a bubbling characteristic. Namely, the bubbling detection pulse generator section 28 inputs an output signal of the probe potential difference detecting section 25 and detects whether the output potential difference between the self-heating sensor probe and the temperature measuring sensor probe has decreased by a predetermined amount or not, so as to detect the occurrence of bubbling of the He gas, thereby generating a pulse signal. Here, as a signal for detecting the occurrence of bubbling, a signal concerning the output potential difference between the sensor probes 20a, 20b for detecting the empty level is preferably employed among output signals of the probe potential difference detecting section 25. The bubbling detection pulse generating section 28 is constituted by an operational amplifier or the like, for example.

The pulse counter 29 counts the number of pulses generated by the bubbling detection pulse generator section 28, i.e., the number of bubbling periods. The count display section 30 displays the number of pulses counted by the pulse counter 29, for example, in a digital fashion. As a consequence, by seeing the display of the count display section 30, the operator can grasp the number of bubbling periods of the He gas with respect to the ampoule 4 currently in use.

Since a single span of bubbling time for the He gas is substantially fixed in a film-forming process carried out by the CVD apparatus 2, the number of bubbling periods necessary for forming a single wafer W is known beforehand. Therefore, the monitor unit 23 can count not only the number of bubbling periods of the He gas but also the number of processed wafers W with respect to the ampoule 4 currently in use, and cause the count display section 30 to digitally display them.

Since the liquid level sensor 18 is equipped with a function of detecting the number of bubbling periods of the He gas according to the output potential difference between the self-heating sensor probe and the temperature measuring sensor probe, not only whether the TDMAT liquid exists within the body 12 or not, but also whether the TDMAT liquid within the body 12 decreases normally or not can be grasped in the foregoing embodiment. When the TDMAT liquid disappears from within one ampoule 4 even though the number of bubbling periods of the He gas is smaller than usual in the ampoule 4, it can be determined that a certain abnormality such as leakage of the TDMAT liquid occurs. Since the liquid level of the TDMAT liquid within the ampoule 4 is determined by using such a liquid level sensor 18, the state of the TDMAT liquid within the ampoule 4 can effectively be monitored, which is advantageous in terms of quality control.

Though the bubbling count means for detecting the number of bubbling periods of the He gas is constituted by the bubbling detection pulse generator section 28 and the pulse counter 29 in this embodiment, an A/D converter, a CPU, and the like, for example, may be provided so as to construct such a function in terms of software together with the function of detecting the liquid level of the TDMAT liquid.

Though two sets of sensor probe sections each comprising a self-heating sensor probe and a temperature measuring sensor probe are provided in this embodiment, a single set of sensor probe section may be provided alone, or three or more sets of sensor probe sections may be provided so as to have respective front end positions different from each other.

A second embodiment of the present invention will be explained with reference to FIGS. 5 to 7. Among the drawings, members identical or equivalent to those of the first embodiment will be referred to with numerals or letters identical thereto without repeating their explanations.

Figure 5:
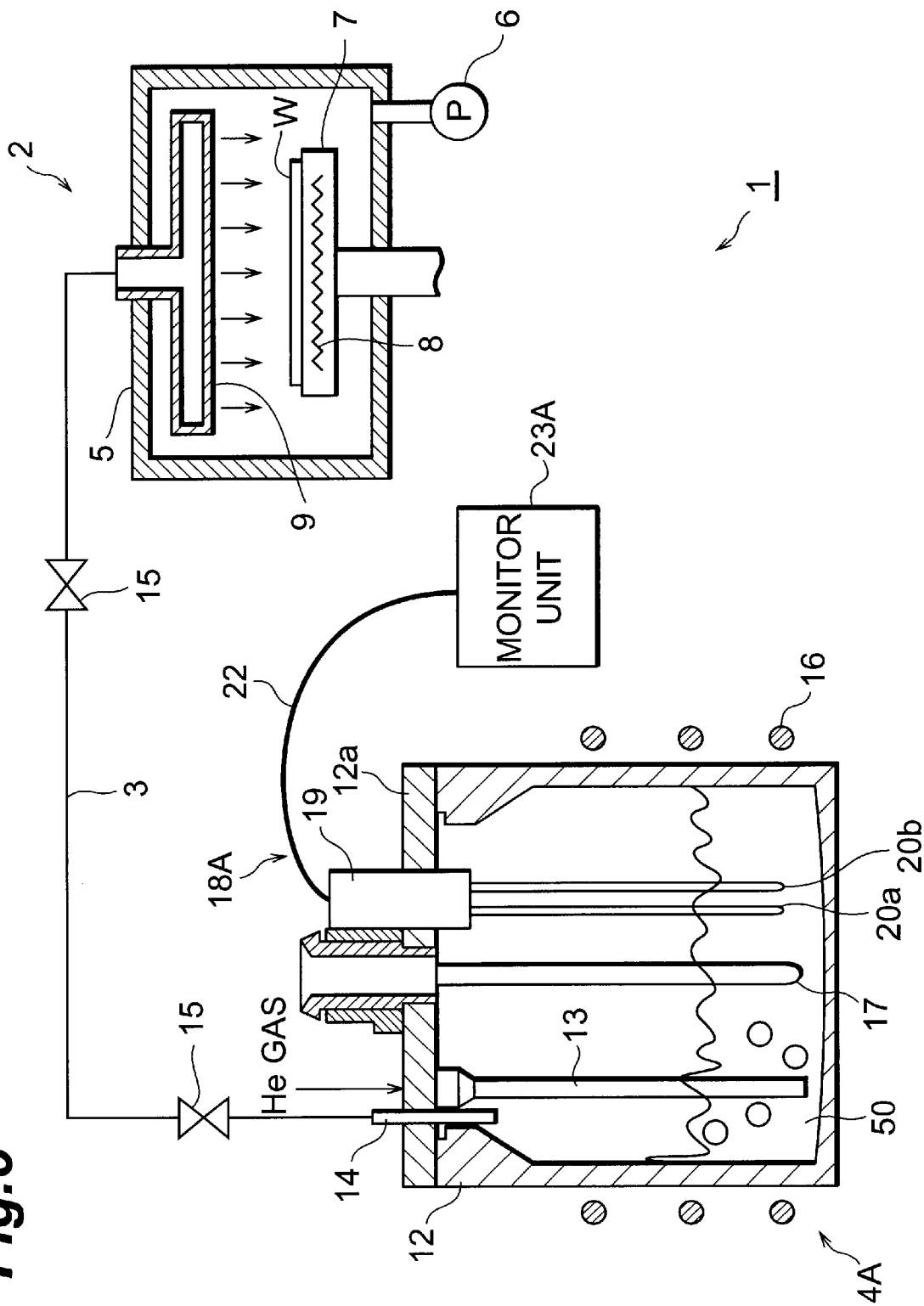
FIG. 5 is a diagram showing an outline of a film-forming system including a second embodiment of the ampoule in accordance with the present invention.

FIG. 5 is a configurational view showing an outline of a film-forming system including the second embodiment of the ampoule in accordance with the present invention. In this drawing, the ampoule 4A of this embodiment is provided with a liquid level sensor 18A for detecting the liquid level of the TDMAT liquid 50. This liquid level sensor 18A has a pair of sensor probes 20a, 20b and a monitor unit 23A connected to the sensor probes 20a, 20b by way of leads 22. As mentioned above, the sensor probe 20a is a self-heating high-temperature sensor probe whereas the sensor probe 20b is a temperature measuring low-temperature sensor probe.

Figure 6:
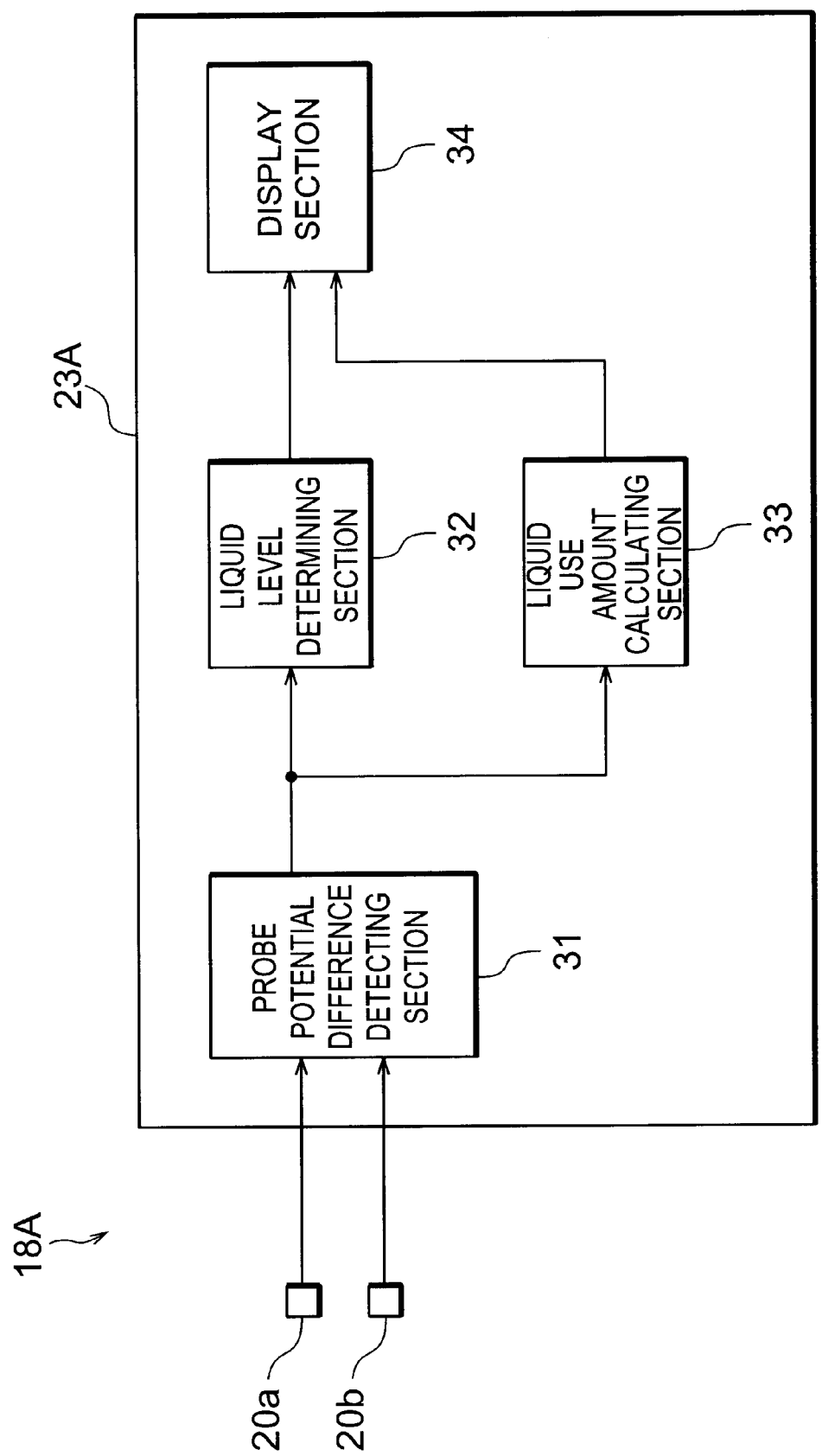
FIG. 6 is a view showing the configuration of the monitor unit shown in FIG. 5.

As shown in FIG. 6, the monitor unit 23A has a probe potential difference detecting section (temperature difference detecting means) 31, a liquid level determining section (liquid level determining means) 32, a liquid use amount calculating section (arithmetic means) 33, and a display section (display means) 34.

The probe potential difference detecting section 31 detects the output potential difference (temperature difference) between the sensor probes 20a, 20b. According to the output potential difference between the sensor probes 20a, 20b, the liquid level determining section 32 determines whether the liquid level of the TDMAT liquid is located at the empty level or not.

Utilizing the above mentioned bubbling characteristic (see FIG. 4), the liquid use amount calculating section 33 determines the bubbling time of the He gas according to the output potential difference between the sensor probes 20a, 20b, and calculates the amount of use and remaining amount of the TDMAT liquid from the bubbling time. The display section 34 displays whether the liquid level of the TDMAT liquid is at the empty level or not by means of LED or the like, and displays the amount of use and remaining amount of the TDMAT liquid, for example, in a digital fashion. In view of such a display section 34, the current amount of use and remaining amount of the TDMAT liquid can immediately be grasped.

Figure 7:
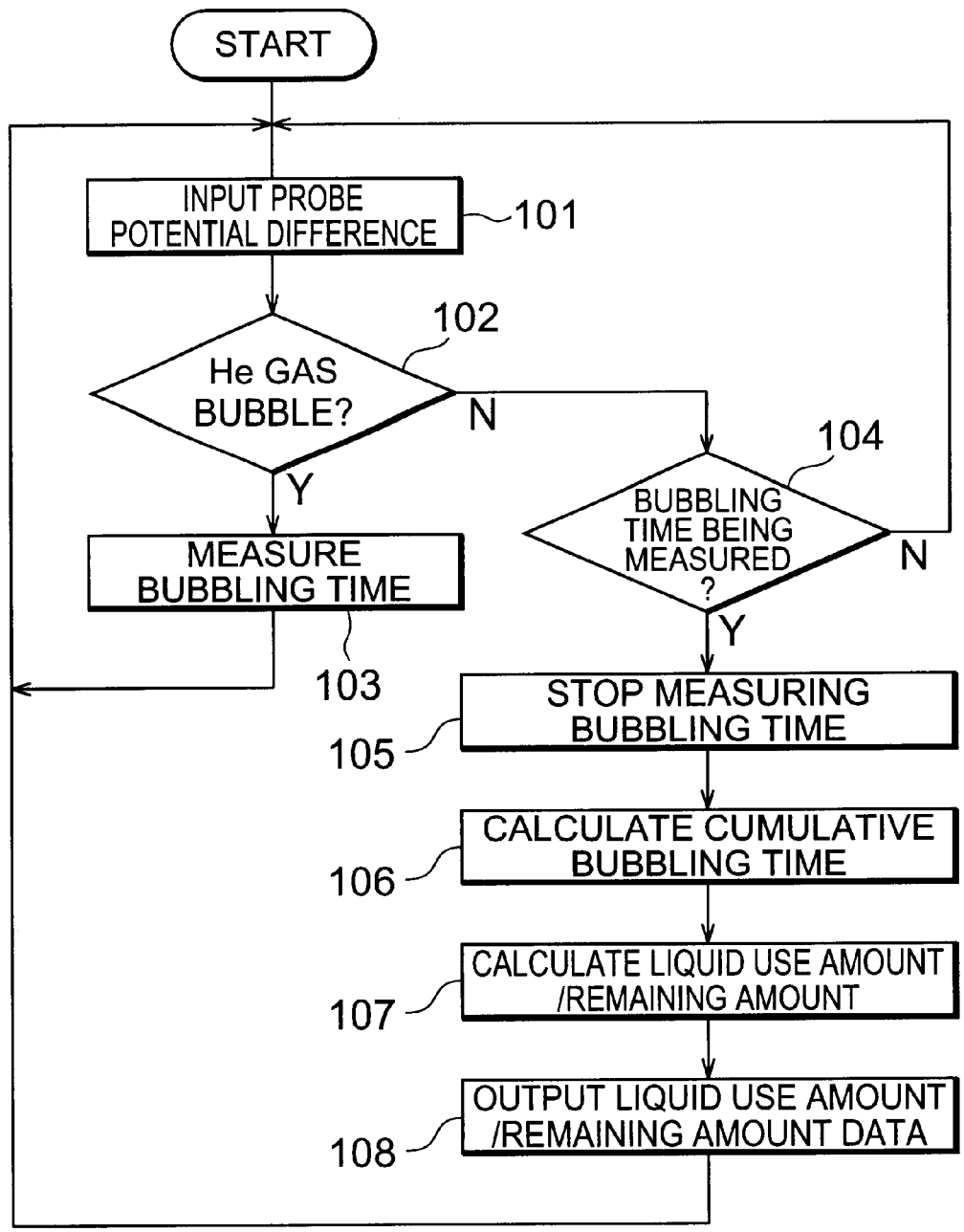
FIG. 7 is a flowchart showing a procedure for calculating the amount of use of liquid carried out by the liquid use amount calculating section shown in FIG. 6.

FIG. 7 shows details of a procedure for calculating the amount of use of liquid carried out by the liquid use amount calculating section 33. First, in this chart, an output signal of the probe potential difference detecting section 31 is inputted (step 101). Subsequently, according to the output potential difference between the sensor probes 20a, 20b, it is determined whether the He gas bubbles or not (step 102). If the output potential difference between the sensor probes 20a, 20b decreases by a predetermined amount (e.g., 0.01 V) from the standard in-liquid level here, then it is determined that the He gas bubbles. If the output potential difference between the sensor probes 20a, 20b rises from the lowest level (0 V in FIG. 4) by a predetermined amount (e.g., 0.01 V), on the other hand, then it is determined that the bubbling of the He gas is terminated. The period of time during which the output potential difference between the sensor probes 20a, 20b decreases from the standard in-liquid level by a predetermined amount will be referred to as a falling timing period, whereas the period of time during which the output potential difference between the sensor probes 20a, 20b rises from the lowest level by a predetermined amount will be referred to as a rising timing period. Hence, it is determined that the He gas bubbles during the span of time from the falling timing period to the rising timing period of the output potential difference between the sensor probes 20a, 20b.

If it is determined that the He gas bubbles at step 102, then the measurement of the bubbling time of the He gas is started (step 103). Subsequently, the flow returns to step 101, and the measurement of the bubbling time is continuously carried out during the bubbling. If it is determined at step 102 that no bubbling occurs, then it is determined whether the bubbling time is being measured or not (step 104). If it is determined that the bubbling time is being measured, then the measurement of the bubbling time is stopped (step 105). As a consequence, the bubbling time of one bubbling period is calculated. This bubbling time is defined as the span of time from the start point of the falling timing period of the output potential difference between the sensor probes 20a, 20b to the start point of the rising timing period thereof, or the end point of the falling timing period of the output potential difference between the sensor probes 20a, 20b to the end point of the rising timing period thereof. Subsequently, the bubbling time is added to the total bubbling time to the present, whereby the cumulative bubbling time is calculated (step 106).

Then, from the cumulative bubbling time and the liquid use amount data per unit time stored beforehand in a memory (not depicted), the current amount of use and remaining amount of the TDMAT liquid are calculated (step 107). Here, the liquid use amount data per unit bubbling time is one acquired by carrying out a bubbling test with a given ampoule beforehand, for example. The remaining amount of the TDMAT liquid is calculated by subtracting the current amount of use from the total liquid volume in the initial state of the ampoule 4, i.e., the state fulfilled with the TDMAT liquid. Subsequently, the use amount data and remaining amount data of the TDMAT liquid are outputted to the display section 34, so as to cause the latter to display the current amount of use and remaining amount of the TDMAT liquid.

Since the volume of the body 12 and the like have been known beforehand in such a liquid use amount calculating section 33, the liquid level of the TDMAT liquid can be calculated in addition to the amount of use or remaining amount of the TDMAT liquid, and can be displayed on the display section 34. Also, the number of processed wafers W with respect to the ampoule 4 currently in use can be counted from the cumulative bubbling time of the He gas, and can be displayed onto the display section 34.

In this embodiment, as in the foregoing, the cumulative bubbling time of the He gas is calculated according to the output potential difference between the sensor probes 20a, 20b, and the amount of use or remaining amount of the TDMAT liquid is calculated from the cumulative bubbling time, whereby not only the liquid level of the TDMAT liquid is determined, but also how much of the TDMAT liquid remaining within the body 12 can be grasped in an analog fashion. Therefore, the usability of the liquid level sensor becomes better.

Also, since the remaining amount of the TDMAT liquid can be seen in an analog fashion, it will basically be sufficient if only a single set of self-heating sensor probe 20a and a temperature measuring sensor probe 20b exists, whereby the structure of the liquid level sensor is simplified.

A third embodiment of the present invention will be explained with reference to FIGS. 8 to 10. In the drawings, members identical or equivalent to those of the first and second embodiments will be referred to with numerals or letters identical thereto without repeating their explanations.

Figure 8:
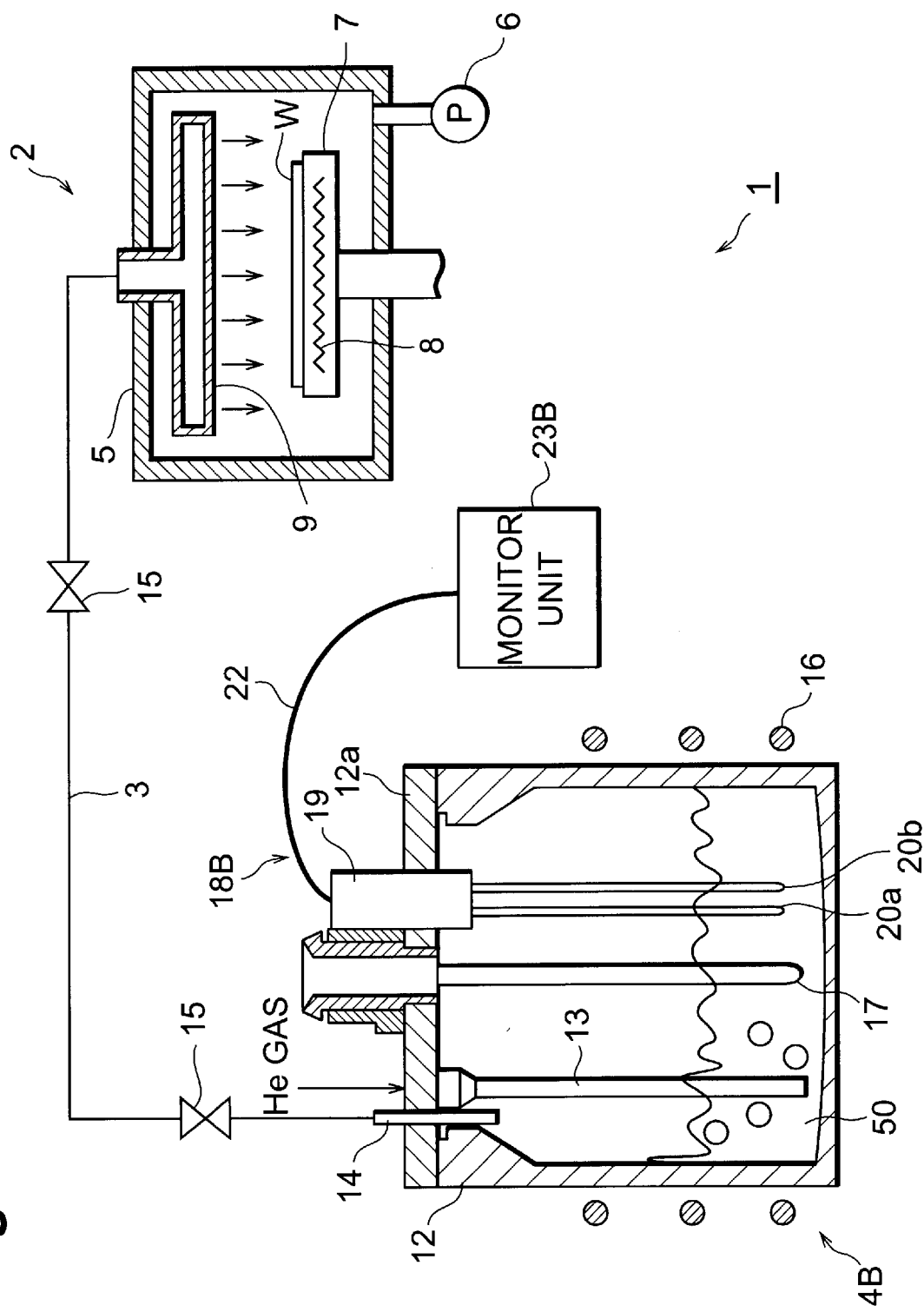
FIG. 8 is a diagram showing an outline of a film-forming system including a third embodiment of the ampoule in accordance with the present invention.

FIG. 8 is a diagram showing an outline of a film-forming system including a third embodiment of the ampoule in accordance with the present invention. In this drawing, the ampoule 4B of this embodiment is provided with a liquid level sensor 18B for detecting the liquid level of the TDMAT liquid 50. The liquid level sensor 18B has a pair of sensor probes 20a, 20b and a monitor unit 23B connected to the sensor probes 20a, 20b by way of leads 22.

Figure 9:
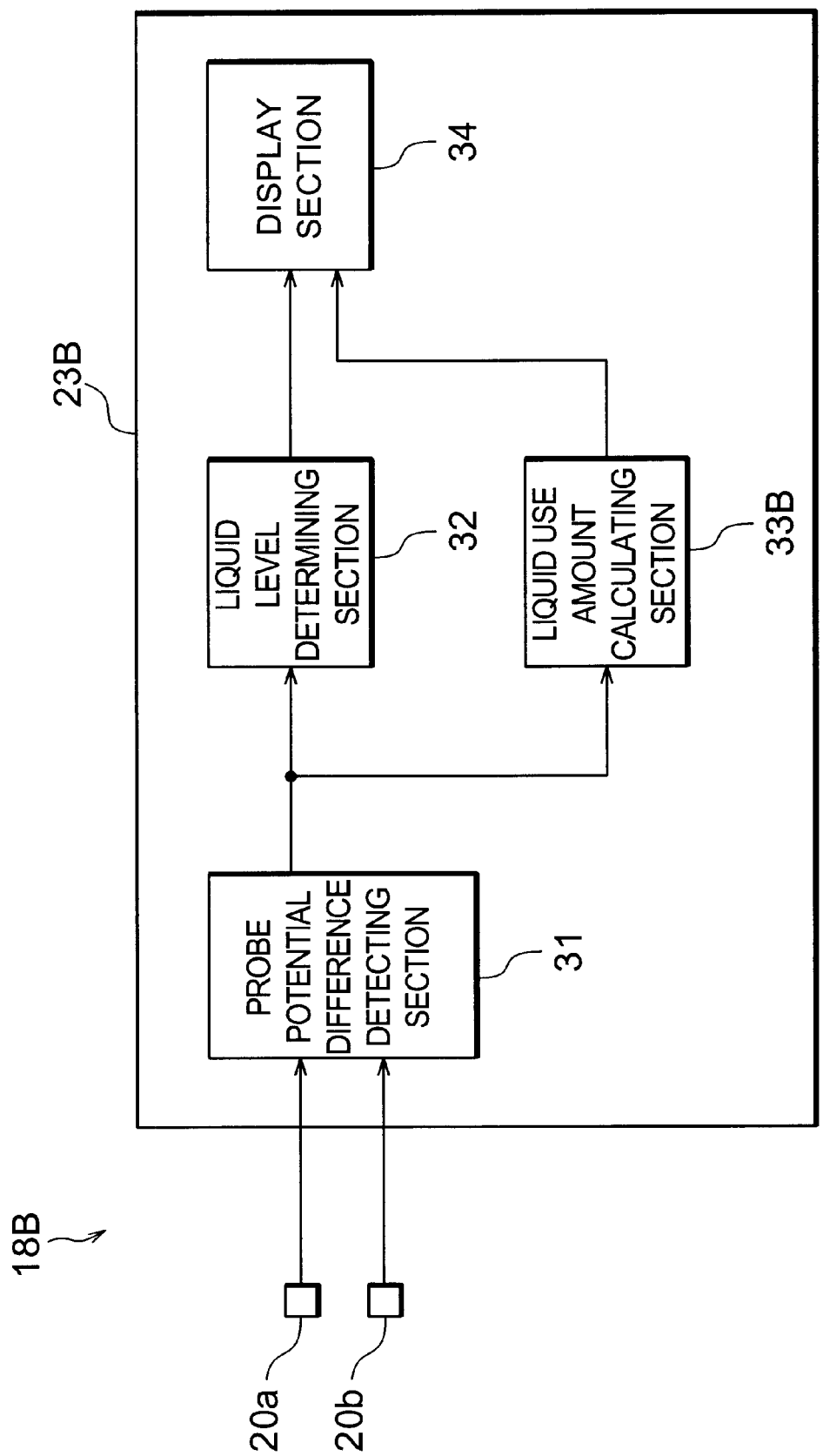
FIG. 9 is a view showing the configuration of the monitor unit shown in FIG. 8.

As shown in FIG. 9, the monitor unit 23B has the above-mentioned probe potential difference detecting section 31, the above-mentioned liquid level determining section 32, a liquid use amount calculating section 33B, and the above-mentioned display section 34.

Utilizing the above-mentioned bubbling characteristic (see FIG. 4), the liquid use amount calculating section 33B counts the number of bubbling periods of the He gas according to the output potential difference between the sensor probes 20a, 20b, and calculates the amount of use and remaining amount of the TDMAT liquid in the ampoule 4 from the number of bubbling periods. Since the bubbling time per bubbling period is constant at about 15 seconds in the bubbling shown in FIG. 4, the amount of use of liquid per bubbling period becomes substantially constant.

Figure 10:
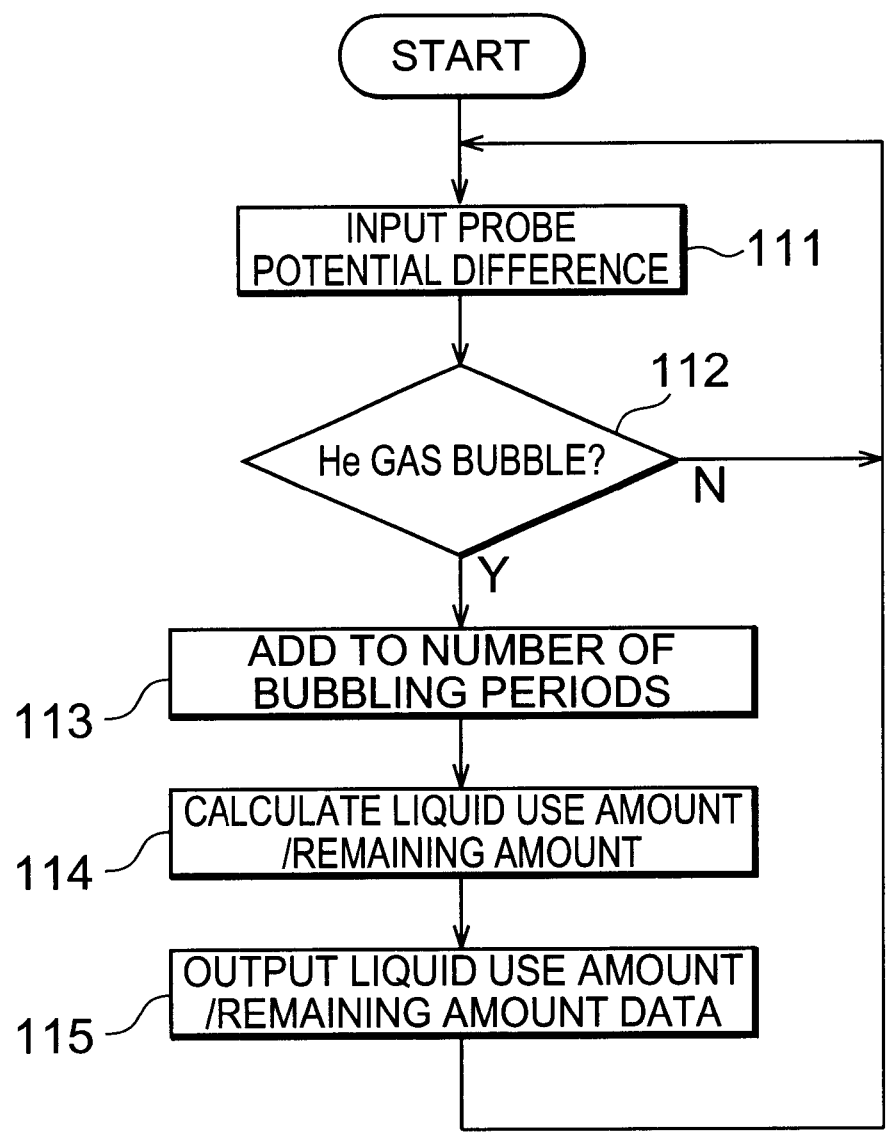
FIG. 10 is a flowchart showing a procedure for calculating the amount of use of liquid carried out by the liquid use amount calculating section shown in FIG. 9.

FIG. 10 shows details of a procedure for calculating the amount of use of liquid carried out by the liquid use amount calculating section 33B. First, in this chart, an output signal of the probe potential difference detecting section 31 is inputted (step 111). Subsequently, according to the output potential difference between the sensor probes 20a, 20b, it is determined whether the He gas bubbles or not (step 112). Whether the bubbling occurs or not is determined in a manner similar to the method in the second embodiment.

If it is determined that the He gas bubbles, then it is added to the number of bubbling periods of the He gas (step 113). Subsequently, according to the number of bubbling periods and the liquid use amount data per bubbling period stored beforehand in a memory (not depicted), the current amount of use and remaining amount of the TDMAT liquid are calculated (step 114). Here, the liquid use amount data per unit bubbling period is one acquired by carrying out a bubbling test with a given ampoule beforehand, for example. The remaining amount of the TDMAT liquid is calculated by subtracting the current amount of use from the total liquid volume in the initial state of the ampoule 4, i.e., the state fulfilled with the TDMAT liquid.

Subsequently, the use amount data and remaining amount data of the TDMAT liquid-are outputted to the display section 34, so as to cause the latter to display the current amount of use and remaining amount of the TDMAT liquid (step 115).

Though the number of bubbling periods is counted by means of software here, it may also be counted by means of hardware. For example, a pulse signal is generated when a falling timing or rising timing of the output potential difference between the sensor probes 20a, 20b is detected, and the number of pulses is counted by a pulse counter.

Such a liquid use amount calculating section 33B can also count the number of processed wafers W with respect to the ampoule 4 currently in use from the number of bubbling periods of the He gas, and cause the display section 34 to display thus counted number.

In this embodiment, as in the foregoing, the number of bubbling periods of the He gas is counted according to the output potential difference between the sensor probes 20a, 20b, and the amount of use and remaining amount of the TDMAT liquid are calculated from the number of bubbling periods, whereby not only whether the liquid level of the TDMAT liquid is at the empty level or not, but also how much the TDMAT liquid remains within the body 12 can be grasped in an analog fashion.

A fourth embodiment of the present invention will be explained with reference to FIGS. 11 to 14. In the drawings, members identical or equivalent to those of the first embodiment will be referred to with numerals or letters identical thereto without repeating their explanations.

Figure 11:
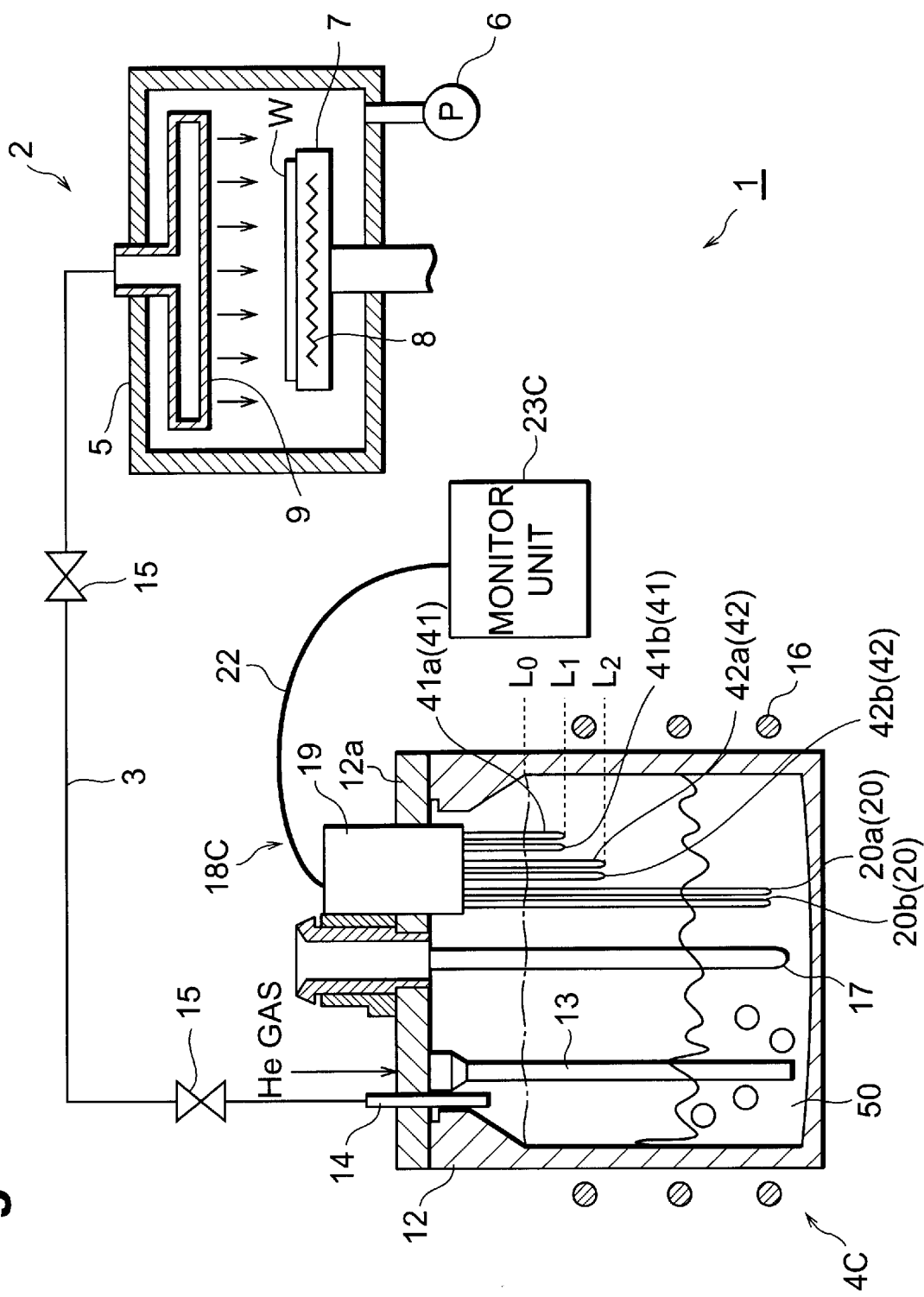
FIG. 11 is a diagram showing an outline of a film-forming system including a fourth embodiment of the ampoule in accordance with the present invention.

FIG. 11 is a diagram showing an outline of a film-forming system including a fourth embodiment of the ampoule in accordance with the present invention. In this drawing, the ampoule 4C of this embodiment is provided with a liquid level sensor 18C for detecting the liquid level of the TDMAT liquid 50. The liquid level sensor 18C is equipped with a liquid level detecting sensor probe section (first temperature measuring sensor probe section) 20 comprising a self-heating high-temperature sensor probe (first self-heating sensor probe) 20a and a temperature measuring low-temperature sensor probe (first temperature measuring sensor probe) 20b; a detection-assisting sensor probe section (second sensor probe section) 41 comprising a self-heating high-temperature sensor probe (second self-heating sensor probe) 41a and a temperature measuring low-temperature sensor probe (second temperature measuring sensor probe) 41b; and a detection-assisting sensor probe section (second sensor probesection) 42 comprising a self-heating high-temperature sensor probe (second self-heating sensor probe) 42a and a temperature measuring low-temperature sensor probe (second temperature measuring sensor probe) 42b.

The sensor probe sections 20, 41, 42 are arranged such that their front ends extend downward within the body 12 so as to be immersed in the TDMAT liquid 50. The liquid level detecting sensor probe section 20 extends to the vicinity of the bottom face of the body 12, whereas the detection-assisting sensor probe sections 41, 42 extend to a position higher than the lower end (front end) of the liquid level detecting sensor probe section 20. The lower end of the sensor probe section 41 is positioned higher than the lower end of the sensor probe section 42. The individual sensor probes of the sensor probe sections 20, 41, 42 are connected to a monitor unit 23C by way of leads 22.

Figure 12:
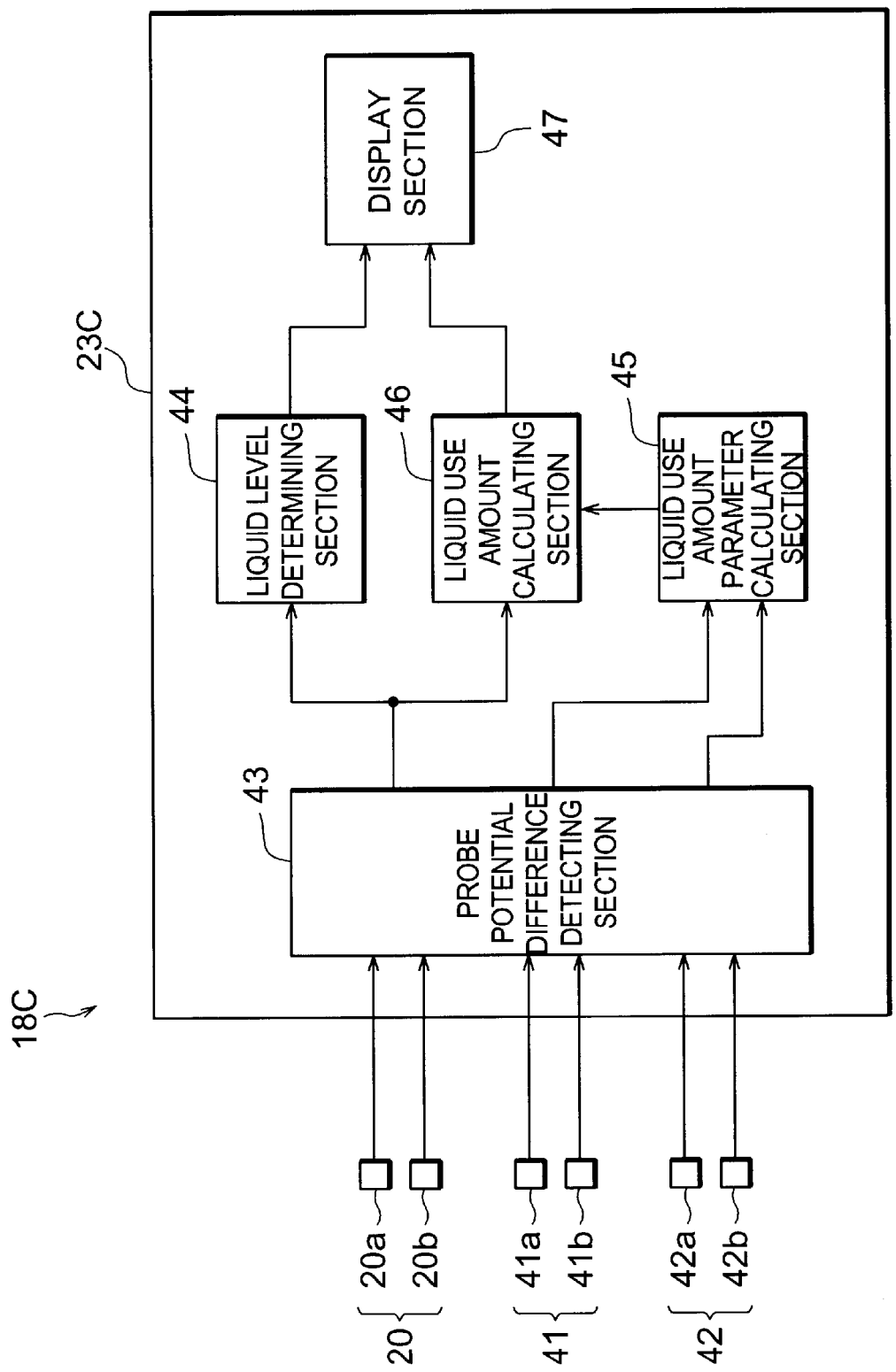
FIG. 12 is a view showing the configuration of the monitor unit shown in FIG. 11.

As shown in FIG. 12, the monitor unit 23C comprises a probe potential difference detecting section (temperature difference detecting means) 43, a liquid level determining section (liquid level determining means) 44, a liquid use amount parameter calculating section (first arithmetic means) 45, a liquid use amount calculating section (second arithmetic means) 46, and a display section (display means) 47.

The probe potential difference detecting section 43 detects the output potential difference between the sensor probes 20a, 20b of the liquid level detecting sensor probe section 20; the output potential difference between the sensor probes 41a, 41b of the detection-assisting sensor probe section 41; and the output potential difference between the sensor probes 42a, 42b of the detection-assisting sensor probe section 42.

According to the output potential difference between the sensor probes 20a, 20b of the liquid level detecting sensor probe section 20, the liquid level determining section 44 determines whether the liquid level of the TDMAT liquid is at the empty level or not.

According to the output potential difference between the sensor probes 41a, 41b of the detection-assisting sensor probe section 41 and the output potential difference between the sensor probes 42a, 42b of the detection-assisting sensor probe section 42, the liquid use amount parameter calculating section 45 calculates the amount of use of liquid per bubbling period of the He gas.

The liquid use amount calculating section 46 counts the number of bubbling periods of the He gas according to the output potential difference between the sensor probes 20a, 20b of the liquid level detecting sensor probe section 20, and calculates the amount of use and remaining amount of the TDMAT liquid from the number of bubbling periods and the amount of use of liquid per bubbling period determined by the liquid use amount parameter calculating section 45.

Here, utilizing the above-mentioned bubbling characteristic (see FIG. 4), the liquid use amount parameter calculating section 45 and the liquid use amount calculating section 46 carry out calculations.

The display section 47 displays whether or not the liquid level of the TDMAT liquid is at the empty level by means of LED or the like, and displays the amount of use and remaining amount of the TDMAT liquid, for example, in a digital fashion. In view of such a display section 47, the current amount of use and remaining amount of the TDMAT liquid can immediately be grasped. In addition to these information items, the amount of use of liquid per bubbling period determined by the liquid use amount parameter calculating section 45 may also be displayed.

Figure 13:
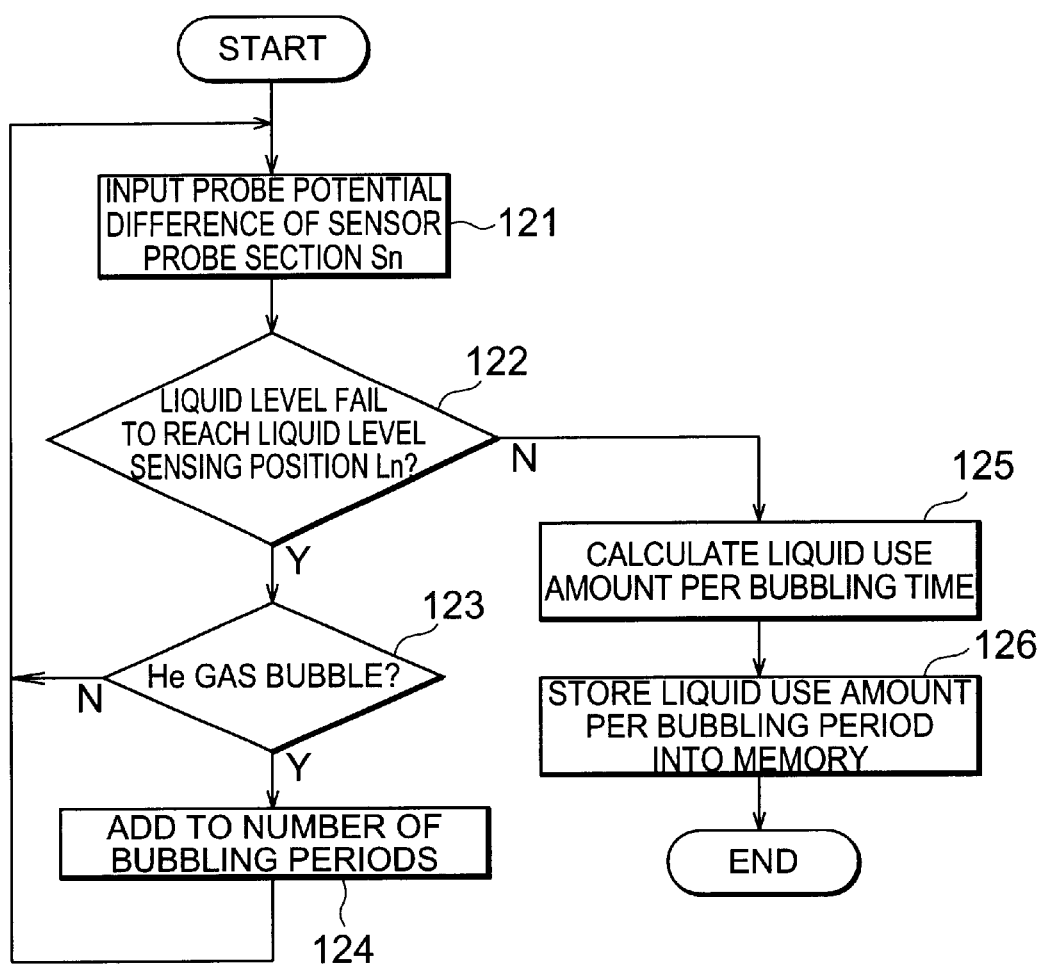
FIG. 13 is a flowchart showing an arithmetic processing procedure carried out by the liquid use amount parameter calculating section shown in FIG. 12.

FIG. 13 shows details of an arithmetic processing procedure carried out by the liquid use amount parameter calculating section 45. Here, the detection-assisting sensor probe section 41 is referred to as a sensor probe section $S_1$, the detection-assisting sensor probe section 42 is referred to as a sensor probe section S2, and they are collectively referred to as a sensor probe section Sn (n=1, 2).

In FIG. 13, the output potential difference (hereinafter referred to as probe potential difference) between the self-heating high-temperature probe and temperature measuring low-temperature probe of the sensor probe section Sn is inputted from the probe potential difference detecting section 43 (step 121). Then, according to the probe potential difference, it is determined whether the liquid level of the TDMAT liquid within the body 12 reaches the lower end height (liquid level sensing position) Ln of the sensor probe section Sn or not, i.e., whether the lower end part of the sensor probe section Sn is located within the TDMAT gas or not (step 122).

If it is determined that the liquid level of the TDMAT liquid is not lowered to the lower height Ln of the sensor probe section Sn here, then it is determined whether or not the He gas bubbles according to the probe output potential difference of the sensor probe section Sn (step 123). Whether the bubbling occurs or not is determined in a manner similar to the method in the second embodiment. Whether the bubbling occurs or not may also be determined according to the output potential difference between the sensor probes 20a, 20b of the liquid level detecting sensor probe section 20.

If it is determined that the He gas bubbles here, then it is added to the number of bubbling periods of the He gas (step 124). Thereafter, the flow returns to step 121, so as to repeat the above-mentioned processing.

If it is determined at step 122 that the liquid level of the TDMAT liquid within the body 12 is lowered to the lower end height Ln of the sensor probe section Sn, then the amount of use of liquid per bubbling period is calculated (step 125). Here, the liquid volume by which the TDMAT liquid within the body 12 is located at the initial liquid level position $L_0$ (see FIG. 11), i.e., in the full filled state, is determined beforehand. Since the volume of the body 12 and the like have also been known beforehand, the liquid volume at the time when the liquid level of the TDMAT liquid is located at the lower end height Ln of the sensor probe section Sn can easily be obtained. Therefore, the amount of use of the TDMAT liquid from the initial state until the TDMAT liquid reaches the lower end height Ln of the sensor probe section Sn canbe seen, and the amount of use of the liquid per bubbling period can be determined from the amount of use of the liquid and the number of bubbling periods.

Subsequently, the liquid use amount data per bubbling period is stored into a memory which is not depicted (step 126).

First, when the liquid level of the TDMAT liquid reaches the lower end height $L_1$ (see FIG. 11) of the sensor probe section 41, such a liquid use amount parameter calculating section 45 determines the initial liquid use amount per bubbling period according to the amount of use of the TDMAT liquid between the initial liquid level position $L_0$ and the liquid sensing position $L_1$ and the number of bubbling periods at that time. Subsequently, if the liquid level of the TDMAT liquid reaches the lower end height $L_2$ (see FIG. 11) of the sensor probe section 42, then the liquid use amount per bubbling period is determined according to the amount of use of the TDMAT liquid between the initial liquid level position $L_0$ and the liquid sensing position $L_2$ and the number of bubbling periods at that time. Namely, the liquid use amount per bubbling period is corrected at the liquid level sensing position $L_2$. Since the liquid level span for calculating the liquid use amount per bubbling period becomes longer as the TDMAT liquid within the body 12 decreases, the liquid use amount per bubbling period can be obtained with a higher accuracy.

The liquid use amount per bubbling period can also be determined from the amount of use of the TDMAT liquid between the liquid level sensing positions $L_1$, $L_2$ and the number of bubbling periods at that time, as a matter of course, instead of the above-mentioned calculating method.

Figure 14:
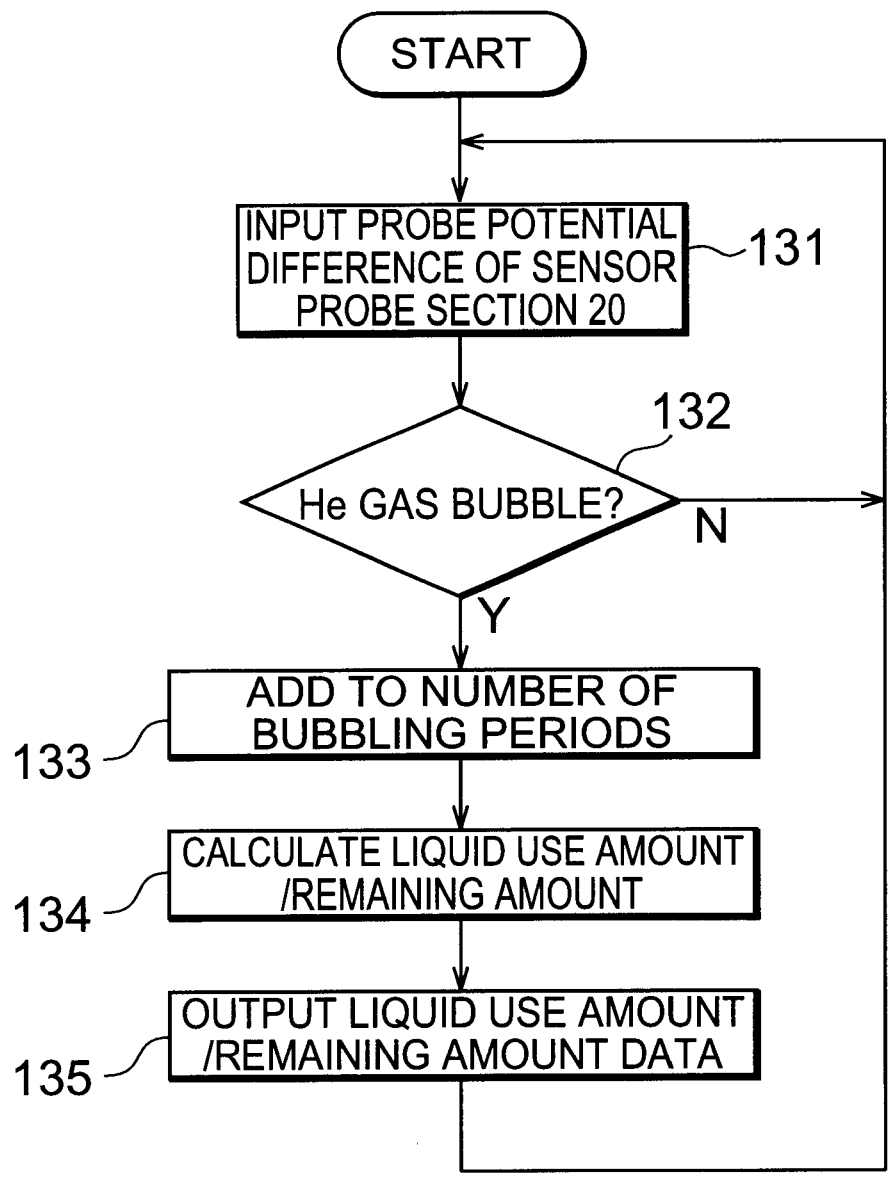
FIG. 14 is a flowchart showing an arithmetic processing procedure carried out by the liquid use amount calculating section shown in FIG. 12.

FIG. 14 shows details of an arithmetic processing procedure carried out by the liquid use amount calculating section 46. In this chart, the probe potential difference of the sensor probe section 20 is initially inputted from the probe potential difference detecting section 43 (step 131). Then, according to this probe potential difference, it is determined whether the He gas bubbles or not (step 132).

If it is determined that the He gas bubbles here, it is added to the number of bubbling periods of the He gas (step 133). Subsequently, the current amount of use and remaining amount of the TDMAT liquid are calculated (step 134) from the number of bubbling periods and the liquid use amount per bubbling period previously stored in the memory (not depicted). Then, the use amount data and remaining amount data of the TDMAT liquid are outputted to the display section 47, so as to cause the latter to display the current amount of use and remaining amount of the TDMAT liquid (step 135).

Since this embodiment is configured so as to initially calculate the liquid use amount per bubbling period according to the probe potential differences in the detection-assisting sensor probe sections 41, 42, count the number of bubbling periods of the He gas according to the probe potential difference of the liquid level detecting sensor probe section 20 thereafter, and calculate the amount of use or remaining amount of the TDMAT liquid from the number of bubbling periods and the liquid use amount per bubbling period, the state of the TDMAT liquid within the body 12 can effectively be grasped. Namely, not only whether the liquid level of the TDMAT liquid is at the empty level or not but also how much the TDMAT liquid remains within the body 12 can be grasped in an analog fashion.

Also, even when the liquid use amount per bubbling period fluctuates among process chambers 5 which are connected to the ampoule 4, appropriate amount of use and remaining amount of the TDMAT liquid can always be seen. The liquid use amount per bubbling period may vary due to differences in the length and structure of gas pipes 3 and the like when different process chambers 5 are connected to the ampoule 4. Since the liquid use amount per bubbling period in the current apparatus is calculated according to output signals of the detection-assisting sensor probe sections 41, 42, which is then used for determining the amount of use and remaining amount of the TDMAT liquid, this embodiment is free from influences of individual differences among process chambers.

Though this embodiment has two sets of detection-assisting sensor probe sections, a single set of detection-assisting sensor probe sections may be provided alone, or three or more sets may be provided.

While embodiments of the liquid level sensor, ampoule, and liquid amount detection method in accordance with the present invention are explained in the foregoing, the present invention is not restricted to the above-mentioned embodiments. For example, though the ampoule in the above-mentioned embodiment stores the TDMAT liquid for forming a titanium nitride film by a CVD process, the liquid to be stored is not restricted thereto in particular, whereby any of liquids such as TEOS and $TiCl_4$ can be employed as long as they are usable in a liquid source bubbling system such as the one mentioned above. Also, the destination to which the process gas generated upon bubbling is supplied is not limited to the CVD apparatus. Further, the bubbling gas for generating the bubbling is not limited to the He gas, whereby an argon gas or the like can also be used.

What is claimed is:

1. A liquid level sensor for detecting a level of a liquid contained in an ampoule in which a bubbling gas is introduced, said liquid level sensor comprising:
   a self-heating sensor probe and a temperature measuring sensor probe which are disposed within said ampoule;
   temperature difference detecting means for detecting a temperature difference between said self-heating sensor probe and said temperature measuring sensor probe; and
   bubbling count means for counting the number of bubbling periods of said bubbling gas according to said temperature difference.

2. A liquid level sensor according to claim 1, further comprising liquid level determining means for determining a level of said liquid according to said temperature difference.

3. A liquid level sensor according to claim 1, wherein said bubbling count means has pulse generating means for generating a pulse signal when said temperature difference decreases by a predetermined amount, and a pulse counter for counting the number of pulses generated by said pulse generating means.

4. A liquid level sensor according to claim 1, further comprising display means for displaying said number of bubbling periods counted by said bubbling count means.

5. A liquid level sensor according to claim 1, wherein a plurality of sensor probe sections each comprising said self-heating sensor probe and said temperature measuring sensor probe are provided, said sensor probe sections having respective front end positions different from each other.

6. A liquid level sensor for detecting a level of a liquid contained in an ampoule in which a bubbling gas is introduced, said liquid level sensor comprising:
   a self-heating sensor probe and a temperature measuring sensor probe which are disposed within said ampoule;
   temperature difference detecting means for detecting a temperature difference between said self-heating sensor probe and said temperature measuring sensor probe; and
   arithmetic means for determining a bubbling time of said bubbling gas according to said temperature difference and calculating an amount of use of said liquid in said ampoule from said bubbling time.

7. A liquid level sensor according to claim 6, further comprising liquid level determining means for determining a level of said liquid according to said temperature difference.

8. A liquid level sensor according to claim 6, wherein said arithmetic means stores liquid use amount data per unit bubbling time beforehand and calculates said amount of use of said liquid in said ampoule from said bubbling time of said bubbling gas and said liquid use amount data per unit bubbling time.

9. A liquid level sensor according to claim 6, wherein said arithmetic means measures an interval from a falling timing period of said temperature difference to a rising timing period of said temperature difference, so as to determine said bubbling time.

10. A liquid level sensor according to claim 6, further comprising display means for displaying said amount of use of said liquid or remaining amount of said liquid in said ampoule calculated by said arithmetic means.

11. A liquid level sensor for detecting a level of a liquid contained in an ampoule in which a bubbling gas is introduced, said liquid level sensor comprising:
   a self-heating sensor probe and a temperature measuring sensor probe which are disposed within said ampoule;
   temperature difference detecting means for detecting a temperature difference between said self-heating sensor probe and said temperature measuring sensor probe; and
   arithmetic means for counting the number of bubbling periods of said bubbling gas according to said temperature difference and calculating an amount of use of said liquid in said ampoule from said number of bubbling periods.

12. A liquid level sensor according to claim 11, further comprising liquid level determining means for determining a level of said liquid according to said temperature difference.

13. A liquid level sensor according to claim 11, wherein said arithmetic means stores liquid use amount data per bubbling period beforehand and calculates said amount of use of said liquid in said ampoule from said number of bubbling periods of said bubbling gas and said liquid use amount data per bubbling period.

14. A liquid level sensor according to claim 11, wherein said arithmetic means detects at least one of a falling timing of said temperature difference and a rising timing of said temperature difference, and counts said number of bubbling periods of said bubbling gas.

15. A liquid level sensor according to claim 11, further comprising display means for displaying said amount of use of said liquid or remaining amount of said liquid in said ampoule calculated by said arithmetic means.

16. A liquid level sensor for detecting a level of a liquid contained in an ampoule in which a bubbling gas is introduced, said liquid level sensor comprising:
a first sensor probe section, disposed within said ampoule, comprising a first self-heating sensor probe and a first temperature measuring sensor probe;
a second sensor probe section, disposed within said ampoule so as to have a lower end positioned higher than that of said first sensor probe section, comprising a second self-heating sensor probe and a second temperature measuring sensor probe;
temperature difference detecting means for detecting a temperature difference between said first self-heating sensor probe and said first temperature measuring sensor probe, and a temperature difference between said second self-heating sensor probe and said second temperature measuring sensor probe;
first arithmetic means for calculating an amount of use of liquid per bubbling period of said bubbling gas according to said temperature difference between said second self-heating sensor probe and said second temperature measuring sensor probe; and
second arithmetic means for counting the number of bubbling periods of said bubbling gas according to said temperature difference between said first self-heating sensor probe and said first temperature measuring sensor probe, and calculating an amount of use of said liquid in said ampoule from said number of bubbling periods and said amount of use of said liquid per bubbling period.

17. A liquid level sensor according to claim 16, further comprising liquid level determining means for determining a level of said liquid according to said temperature difference between said first self-heating sensor probe and said first temperature measuring sensor probe.

18. A liquid level sensor according to claim 16, wherein said first arithmetic means counts the number of bubbling periods of said bubbling gas until the level of said liquid reaches a height at which said lower end of said second sensor probe section is located according to the temperature differences between said second self-heating sensor probes and said second temperature measuring sensor probes, and calculates said amount of use of said liquid per bubbling period.

19. A liquid level sensor according to claim 18, wherein said liquid level sensor comprises a plurality of second sensor probe sections having respective lower end heights different from each other; and
wherein said first arithmetic means successively counts numbers of bubbling periods of said bubbling gas until the level of said liquid reaches the respective lower end heights of said second sensor probe sections according to the temperature differences between said second self-heating sensor probes and said second temperature measuring sensor probes, and renews said amount of use of said liquid per bubbling period.

20. A liquid level sensor according to claim 18, wherein said first arithmetic means detects at least one of a falling timing of said temperature difference between said second self-heating sensor probe and said second temperature measuring sensor probe, and a rising timing of said temperature difference, and counts said number of bubbling periods.

21. A liquid level sensor according to claim 16, wherein said second arithmetic means detects at least one of a falling timing of said temperature difference between said first self-heating sensor probe and said first temperature measuring sensor probe, and a rising timing of said temperature difference, and counts said number of bubbling periods.

22. A liquid level sensor according to claim 16, further comprising display means for displaying said amount of use of said liquid or remaining amount of said liquid in said ampoule calculated by said second arithmetic means.

23. An ampoule comprising:
a body for accommodating a liquid;
a gas inlet section, provided in said body, for introducing a bubbling gas into said body;
a gas outlet section, provided in said body, for leading a gas generated by bubbling of said bubbling gas to the outside of said body;
a self-heating sensor probe and a temperature measuring sensor probe which are disposed within said body;
temperature difference detecting means for detecting a temperature difference between said self-heating sensor probe and said temperature measuring sensor probe; and
bubbling count means for counting the number of bubbling periods of said bubbling gas according to said temperature difference.

24. An ampoule according to claim 23, further comprising:
a heater for heating said liquid accommodated within said body; and
a temperature sensor for detecting a temperature of said liquid within said body.

25. An ampoule according to claim 23, wherein said gas outlet section is connected to a film-forming apparatus.

26. An ampoule comprising:
a body for accommodating a liquid;
a gas inlet section, provided in said body, for introducing a bubbling gas into said body;
a gas outlet section, provided in said body, for leading a gas generated by bubbling of said bubbling gas to the outside of said body;
a self-heating sensor probe and a temperature measuring sensor probe which are disposed within said body;
temperature difference detecting means for detecting a temperature difference between said self-heating sensor probe and said temperature measuring sensor probe; and
arithmetic means for determining a bubbling time of said bubbling gas according to said temperature difference and calculating an amount of use of said liquid from said bubbling time.

27. An ampoule according to claim 26, further comprising a heater for heating said liquid accommodated within said body; and
a temperature sensor for detecting a temperature of said liquid within said body.

28. An ampoule according to claim 26, wherein said gas outlet section is connected to a film-forming apparatus.

29. An ampoule comprising:
a body for accommodating a liquid;
a gas inlet section, provided in said body, for introducing a bubbling gas into said body;
a gas outlet section, provided in said body, for leading a gas generated by bubbling of said bubbling gas to the outside of said body;
a self-heating sensor probe and a temperature measuring sensor probe which are disposed within said body;
temperature difference detecting means for detecting a temperature difference between said self-heating sensor probe and said temperature measuring sensor probe; and arithmetic means for counting the number of bubbling periods of said bubbling gas according to said temperature difference and calculating an amount of use of said liquid from said number of bubbling periods.

30. An ampoule according to claim 29, further comprising a heater for heating said liquid accommodated within said body; and a temperature sensor for detecting a temperature of said liquid within said body.

31. An ampoule according to claim 29, wherein said gas outlet section is connected to a film-forming apparatus.

32. An ampoule comprising:

a body for accommodating a liquid;

a gas inlet section, provided in said body, for introducing a bubbling gas into said body;

a gas outlet section, provided in said body, for leading a gas generated by bubbling of said bubbling gas to the outside of said body;

a first sensor probe section, disposed within said body, comprising a first self-heating sensor probe and a first temperature measuring sensor probe;

a second sensor probe section, disposed within said body so as to have a lower end positioned higher than that of said first sensor probe section, comprising a second self-heating sensor probe and a second temperature measuring sensor probe;

temperature detecting means for detecting a temperature difference between said first self-heating sensor probe and said first temperature measuring sensor probe, and a temperature difference between said second self-heating sensor probe and said second temperature measuring sensor probe;

first arithmetic means for calculating an amount of use of said liquid per bubbling period of said bubbling gas according to said temperature difference between said second self-heating sensor probe and said second temperature measuring sensor probe; and second arithmetic means for counting the number of bubbling periods of said bubbling gas according to said temperature difference between said first self-heating sensor probe and said first temperature measuring sensor probe, and calculating an amount of use of said liquid in said ampoule from said number of bubbling periods and said amount of use of said liquid per bubbling period.

33. An ampoule according to claim 32, further comprising a heater for heating said liquid accommodated within said body; and a temperature sensor for detecting a temperature of said liquid within said body.

34. An ampoule according to claim 32, wherein said gas outlet section is connected to a film-forming apparatus.

35. A liquid amount detection method comprising the steps of arranging a self-heating sensor probe and a temperature measuring sensor probe within an ampoule into which a bubbling gas is introduced; detecting a temperature difference between said self-heating sensor probe and said temperature measuring sensor probe; and counting the number of bubbling periods of said bubbling gas according to said temperature difference.

36. A liquid amount detection method comprising the steps of arranging a self-heating sensor probe and a temperature measuring sensor probe within an ampoule into which a bubbling gas is introduced; detecting a temperature difference between said self-heating sensor probe and said temperature measuring sensor probe; determining a bubbling time of said bubbling gas according to said temperature difference; and calculating an amount of use of a liquid accommodated within said ampoule from said bubbling time.

37. A liquid amount detection method comprising the steps of arranging a self-heating sensor probe and a temperature measuring sensor probe within an ampoule into which a bubbling gas is introduced; detecting a temperature difference between said self-heating sensor probe and said temperature measuring sensor probe; counting the number of bubbling periods of said bubbling gas according to said temperature difference; and calculating an amount of use of a liquid accommodated within said ampoule according to said number of bubbling periods.

38. A liquid amount detection method comprising the steps of:

using a liquid level sensor constituted by a first sensor probe section, disposed within an ampoule into which a bubbling gas is introduced, comprising a first self-heating sensor probe and a first temperature measuring sensor probe; and a second sensor probe section, disposed within said ampoule so as to have a lower end positioned higher than that of said first sensor probe section, comprising a second self-heating sensor probe and a second temperature measuring sensor probe;

detecting a temperature difference between said second self-heating sensor probe and said second temperature measuring sensor probe; calculating an amount of use of liquid per bubbling period of said bubbling gas according to said temperature difference; detecting a temperature difference between said first self-heating sensor probe and said first temperature measuring sensor probe thereafter; counting the number of bubbling periods of said bubbling gas according to said temperature difference; and calculating an amount of use of a liquid accommodated within said ampoule according to said number of bubbling periods and said amount of use of liquid per bubbling period.

* * * * *